United States Patent
Huang et al.

(10) Patent No.: US 12,519,080 B2
(45) Date of Patent: Jan. 6, 2026

(54) SYSTEMS FOR FLUXLESS BONDING USING AN ATMOSPHERIC PRESSURE PLASMA AND METHODS FOR PERFORMING THE SAME

(71) Applicant: Taiwan Semiconductor Manufacturing Company Limited, Hsinchu (TW)

(72) Inventors: Hui-Min Huang, Taoyuan (TW); Kai Jun Zhan, Taoyuan (TW); Yi Chen Wu, Taichung (TW); Wei-Hung Lin, Xinfeng Township (TW); Ming-Da Cheng, Taoyuan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 729 days.

(21) Appl. No.: 17/749,200

(22) Filed: May 20, 2022

(65) Prior Publication Data

US 2023/0378123 A1  Nov. 23, 2023

(51) Int. Cl.
*H01L 23/00* (2006.01)
*H01J 37/32* (2006.01)

(52) U.S. Cl.
CPC .......... *H01L 24/81* (2013.01); *H01J 37/3244* (2013.01); *H01J 37/32825* (2013.01);
(Continued)

(58) Field of Classification Search
CPC ......... H01L 24/81; H01L 24/75; H01L 24/16; H01L 2224/16227; H01L 2224/16237; H01L 2224/16238; H01L 2224/75302; H01L 2224/81092; H01L 2224/81097; H01L 2224/81204; H01L 2224/81895;
(Continued)

(56) References Cited

U.S. PATENT DOCUMENTS

| | | | |
|---|---|---|---|
| 2004/0169020 A1* | 9/2004 | Yamauchi | H01L 21/4864 219/121.46 |
| 2008/0023525 A1* | 1/2008 | Maeda | H01L 24/81 228/18 |
| 2012/0104076 A1* | 5/2012 | Suga | H01L 24/75 228/180.22 |

FOREIGN PATENT DOCUMENTS

| | | | |
|---|---|---|---|
| CN | 216161704 U | * | 4/2022 |
| JP | 2004228346 A | * | 8/2004 |

\* cited by examiner

*Primary Examiner* — Norman D Richards
*Assistant Examiner* — Laura M Dykes
(74) *Attorney, Agent, or Firm* — The Marbury Law Group, PLLC

(57) ABSTRACT

A disclosed system is configured to bond a chip to a substrate and includes a chip processing subsystem that is configured to receive the chip and to expose the chip to a first plasma, and a substrate processing subsystem that is configured to receive the substrate and to expose the substrate to a second plasma. The system further includes a bonding subsystem that is configured to align the chip with the substrate, to force the chip and the substrate into direct mechanical contact with one another by application of a compressive force, and to apply heat to at least one of the chip or the substrate. Application of the compressive force and the heat thereby bonds the chip to the substrate. The first and second plasmas may include $H_2/N_2$, $H_2/Ar$, $H_2/He$, $NH_3/N_2$, $NH_3/Ar$, or $NH_3/He$ and the chip and substrate may be maintained in a low oxygen environment.

20 Claims, 17 Drawing Sheets

(52) U.S. Cl.
CPC .............. *H01L 24/75* (2013.01); *H01L 24/16* (2013.01); *H01L 2224/16227* (2013.01); *H01L 2224/16237* (2013.01); *H01L 2224/16238* (2013.01); *H01L 2224/75302* (2013.01); *H01L 2224/81092* (2013.01); *H01L 2224/81097* (2013.01); *H01L 2224/81204* (2013.01); *H01L 2224/81895* (2013.01)

(58) Field of Classification Search
CPC ............ H01L 2224/753; H01J 37/3244; H01J 37/32825
USPC ........................................................ 438/702
See application file for complete search history.

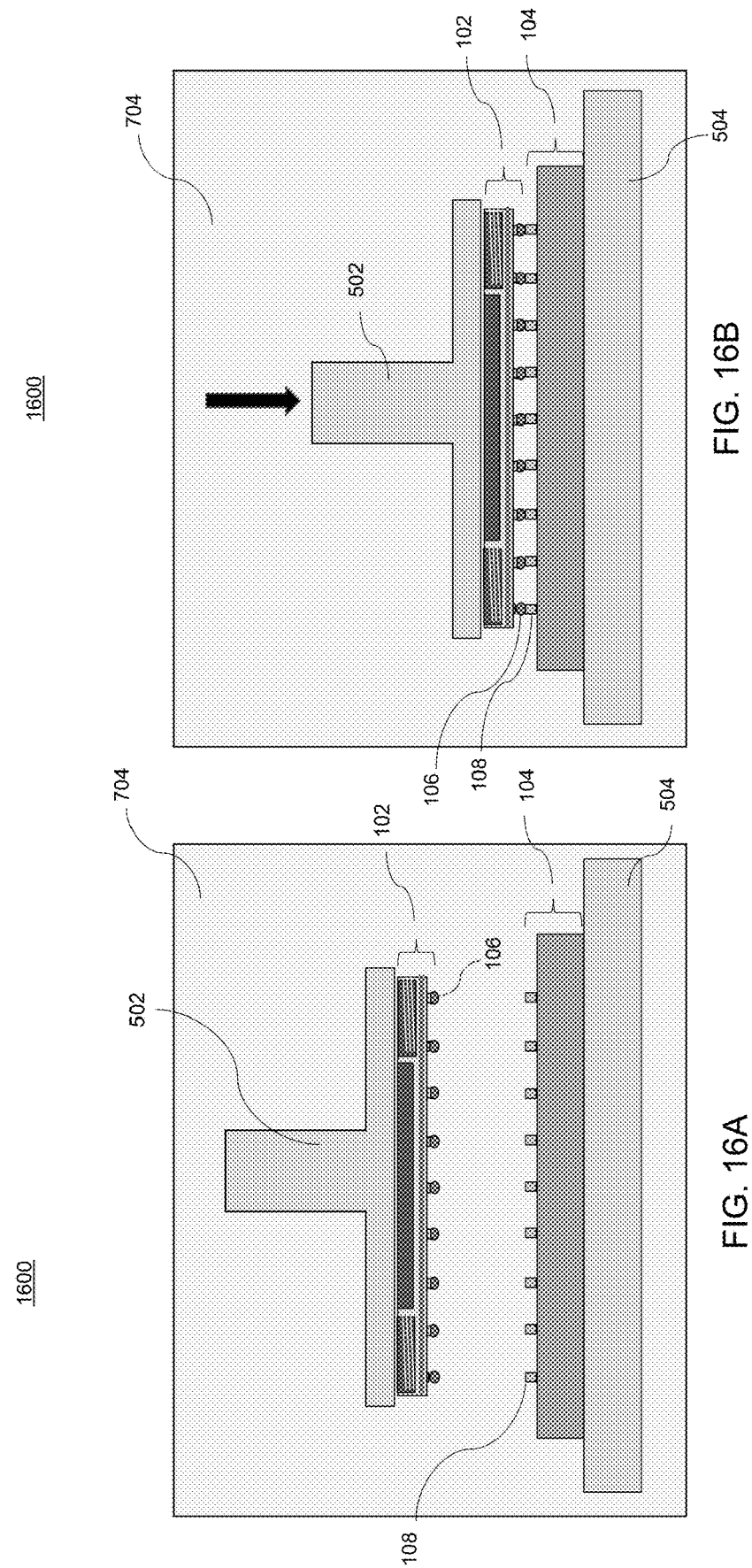

SYSTEMS FOR FLUXLESS BONDING USING AN ATMOSPHERIC PRESSURE PLASMA AND METHODS FOR PERFORMING THE SAME

BACKGROUND

The semiconductor industry has grown due to continuous improvements in integration density of various electronic components (e.g., transistors, diodes, resistors, capacitors, etc.). For the most part, these improvements in integration density have come from successive reductions in minimum feature size, which allows more components to be integrated into a given area.

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16A illustrates a first configuration of a direct bonding apparatus in which an integrated circuit die is aligned with a package substrate prior to bonding of the integrated circuit die and the package substrate, according to various embodiments.

FIG. 16B illustrates a second configuration of the direct bonding apparatus in which an integrated circuit die is in contact with the a package substrate, according to various embodiments.

DETAILED DESCRIPTION

Figure 1:
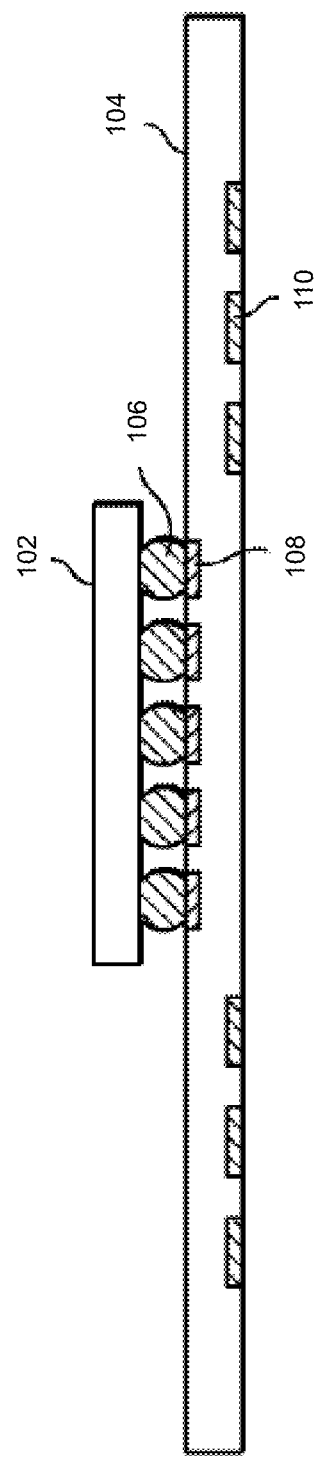
FIG. 1 is a vertical cross-sectional view of a semiconductor device in which an integrated circuit die may be attached to a package substrate, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In various embodiments, bonding of an integrated circuit die to a package substrate may be accomplished using a direct bonding process. In a direct bonding process (e.g., thermal compression bonding (TCB)), metal bumps of a first component may be bonded to metal bumps or bonding pads of a second component through the application of heat and compressive forces. Bonding may be accomplished with or without solder disposed between the metal bumps of the first component and metal bumps or bonding pads of the second component. Various materials used to form the bumps and the bonding pads may form oxides, which may hinder the formation of secure bonds. In some embodiments, oxides may be removed by applying a flux material to one or both of the bumps and the bonding pads. In other embodiments, oxides may be removed by exposing the bumps and bonding pads to a plasma prior to bonding.

According to various embodiments, a system may be configured to bond a chip to a substrate and may include a chip processing subsystem and a substrate processing subsystem. The chip processing subsystem may be configured to receive the chip and to expose the chip to a first plasma. The substrate processing subsystem may be configured to receive the substrate and to expose the substrate to a second plasma. The system may further include a bonding subsystem that may be configured to align the chip with the substrate, to force the chip and the substrate into direct mechanical contact with one another by application of a compressive force, and to apply heat to at least one of the chip or the substrate. The application of the compressive force and the heat thereby bonds the chip that has been exposed to the first plasma to the substrate that has been exposed to the second plasma.

In further embodiments, a system that may be configured to expose a chip or a substrate to a plasma. The embodiment system may include an enclosure that may contain one or more gases that may be maintained at a pressure in a first range from approximately 10 Pa to approximately 120 KPa. The one or more gases may include a concentration of oxygen that may be less than approximately 1,000 ppm. In some embodiments, the enclosure may be maintained at atmospheric pressure (i.e., 101325 Pa) and the plasma may be similarly generated at atmospheric pressure. The embodiment system may further include a mechanical system that may be configured to receive the chip or the substrate and to position the chip or the substrate within the enclosure. Embodiment systems may further include a plasma generation device within the enclosure that may be configured to supply the plasma to the chip or the substrate through a nozzle that is configured to have a line-shaped aperture, a matrix of apertures, a circular aperture, a square-shaped aperture, a rectangular aperture, or an irregularly-shaped aperture.

A disclosed embodiment method of bonding a chip to a substrate may include exposing the chip to a first plasma, exposing the substrate to a second plasma, and aligning the chip with the substrate. The embodiment method may further include applying a compressive force to force the chip and the substrate into direct mechanical contact with one another, and applying heat to at least one of the chip or the substrate, such that application of the compressive force and the heat thereby bonds the chip to the substrate.

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconducting layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components may also use smaller packages that utilize less area than packages of the past.

One type of smaller packaging approach for semiconductor devices is called a flip chip (FC) ball grid array (BGA) package, in which integrated circuit dies may be placed upside-down on a substrate and bonded to the substrate using micro-bumps. The substrate may include wiring configured to connect the micro-bumps on dies to contact pads on the substrate, which may have a larger footprint. An array of solder balls may be formed on the opposite side of the substrate and may be used to electrically connect the packaged die to another circuit component (e.g., a printed circuit board).

FIG. 1 is a vertical cross-sectional view of a semiconductor device 100 in which an integrated circuit die 102 may be attached to a package substrate 104, in accordance with various embodiments. The package substrate 104 may include a ceramic, plastic, and/or organic material, although the package substrate 104 may include other materials in other embodiments. The package substrate 104 may include a substrate configured for use with a flip-chip ball grid array (FC-BGA) package, a flip-chip chip scale package (FC-CSP), a land grid array (LGA) package, a bond-on-trace (BOT) package, etc. Other types of package substrates 104 may be used in other embodiments.

A plurality of integrated circuit dies 102 may also be provided in various embodiments, and may be attached elsewhere on the package substrate 104 (e.g., in areas not shown in see FIG. 1). Each of the integrated circuit dies 102 may include a plurality of circuits and electrical components (not shown) formed thereon. Each of the integrated circuit dies 102 may have been previously fabricated on a semiconductor wafer or workpiece (not shown) made of a semiconductor material such as silicon or other semiconductor material. The wafer or workpiece may then have been singulated along scribe lines to form the plurality of integrated circuit dies 102.

Figure 3:
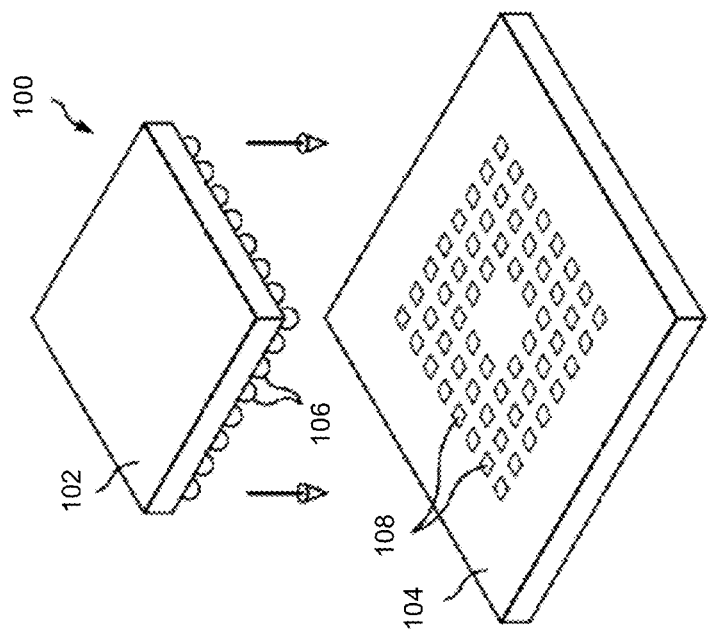
FIG. 3 is a three-dimensional perspective view of a configuration of components in which an integrated circuit die is positioned over a package substrate, according to various embodiments.

Each of the integrated circuit dies 102 may be formed in a shape of a square or rectangle in a top view (e.g., see the perspective view of FIGS. 3). The integrated circuit dies 102 may also be referred to herein as dies, semiconductor devices, chips, etc. A plurality of bumps 106 may be disposed on a surface of each of the integrated circuit dies 102, and the bumps 106 may include electrical contacts for each of the integrated circuit dies 102.

A plurality of bonding pads 108 may be disposed on a top surface of the package substrate 104. The bonding pads 108 may be configured to be coupled to the bumps 106 of each of the integrated circuit dies 102 and may include a spatial arrangement corresponding to a spatial arrangement of the bumps 106. A plurality of contact pads 110 may be disposed on a bottom surface of the package substrate 104. The contact pads 110 may be adapted to be coupled a plurality of solder balls (not shown) in some embodiments. In such embodiments, the solder balls may allow the package substrate 104 to be coupled to another circuit component, such as a printed circuit board.

Conductive wiring (not shown) may be disposed within insulating material layers (also not shown) of the package substrate 104. The conductive wiring may be disposed between, and may electrically connect, the plurality of contact pads 110 and the plurality of bonding pads 108 of the package substrate 104. The conductive wiring, contact pads 110, and bonding pads 108 may include electrical connections that are formed using lithographic techniques within the package substrate 104. The electrical connections may include copper, aluminum, other metals, or multiple layers or combinations thereof. Some of the electrical connections may include a redistribution layer (RDL) (not shown) formed in the package substrate 104 (e.g., proximate to a surface of the package substrate 104) in some embodiments. The RDL may include fan-out regions of wiring. As such, each of the integrated circuit dies 102 may be electrically coupled to the RDL of the package substrate 104.

Figure 2:
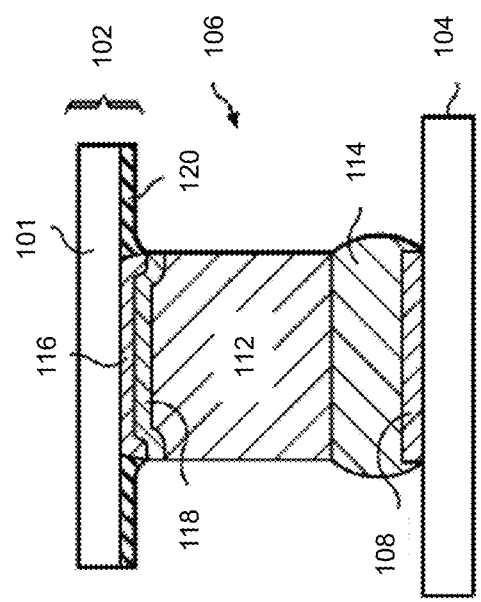
FIG. 2 illustrates a detailed vertical cross-sectional view of a portion of FIG. 1 including one of a plurality of bumps on an integrated circuit die, according to various embodiments.

FIG. 2 illustrates a more detailed cross-sectional view of a portion 200 of FIG. 1 including one of a plurality of bumps 106 on the integrated circuit die 102, according to various embodiments. FIG. 2 illustrates an example bump-on-trace (BOT) joint that may be used in some embodiments. The integrated circuit die 102 may include a workpiece 101 including silicon or other semiconducting material. The integrated circuit die 102 may also include an insulating material 120 and conductive wiring 116 formed proximate to the surface of the workpiece 101. The conductive wiring 116 may be electrically coupled between the bumps 106 and electrical components (not shown) of each of the integrated circuit dies 102 (e.g., see FIG. 1). The conductive wiring 116 may include aluminum pads in some embodiments, for example, although other metals may be used. An under ball metallization (UBM) 118 structure may optionally be formed over the conductive wiring 116 of the integrated circuit dies 102 to facilitate the attachment of the bumps 106.

In some embodiments, the bumps 106 may include microbumps (not shown). Each of the bumps 106 may include a metal stud 112 that may include copper, a copper alloy, or other metals, and solder ball 114 formed over the metal stud 112. Other suitable materials used to form the bumps 106 are within the contemplated scope of disclosure. The metal stud 112 may be formed of any suitable conductive material, including Cu, Ni, Pt, Al, combinations thereof, and may be formed through any number of suitable techniques, including physical vapor deposition (PVD), chemical vapor deposition (CVD), electrochemical deposition (ECD), molecular beam epitaxy (MBE), atomic layer deposition (ALD), electroplating, etc. An optional conductive cap layer (not shown) may be formed between the metal stud 112 and the solder ball 114. For example, in an embodiment in which the metal stud 112 may be formed of copper, a conductive cap layer formed of nickel may be used. Other materials, such as Pt, Au, Ag, combinations thereof, etc., may also be used.

The solder ball 114 may be formed over an end of the metal stud 112 and/or on the optional conductive cap layer. The solder ball 114 may also be directly formed on the wiring 116 or UBM 118 of the integrated circuit dies 102, for example, in embodiments where a metal stud 112 and cap layer may not be included. The solder ball 114 material may include SnPb, a high-Pb material, a Sn-based solder, a lead-free solder, or other suitable conductive materials, as examples. The bumps 106 may include a height (in a vertical direction in the drawings) of about 50 µm or less and a width of about 35 µm, for example, although the bumps may also include other dimensions.

FIG. 3 is a three-dimensional perspective view of a configuration 300 of components in which an integrated circuit die 102 may be positioned over a package substrate 104, according to various embodiments. An example arrangement of bumps 106 on the integrated circuit dies 102, and bonding pads 108 on the package substrate 104, is shown. The bumps 106 may be formed in a peripheral region of the integrated circuit dies 102 and may be arranged in one or more rows in the peripheral region. As an example, the bumps 106 may be arranged in three rows on each side of each of the integrated circuit dies 102 in FIG. 3 along a die edge or in corners (e.g., as shown by the pattern of the bonding pads 108 on the package substrate 104).

The bumps 106 may alternatively be arranged in other patterns and may be positioned in other locations. For example, other embodiments may include bump structures along interior portions of the die. The placement of the bump structures in this example are provided for illustrative purposes only and the specific locations and patterns of the bump structures may vary and may include, as examples, an array of bumps, lines of bumps in a middle region of the integrated circuit dies 102, staggered bumps, etc. The example integrated circuit die 102, including sizes and placement of bumps 106, is provided for reference only and may not reflect actual sizes or actual relative sizes.

Figure 4:
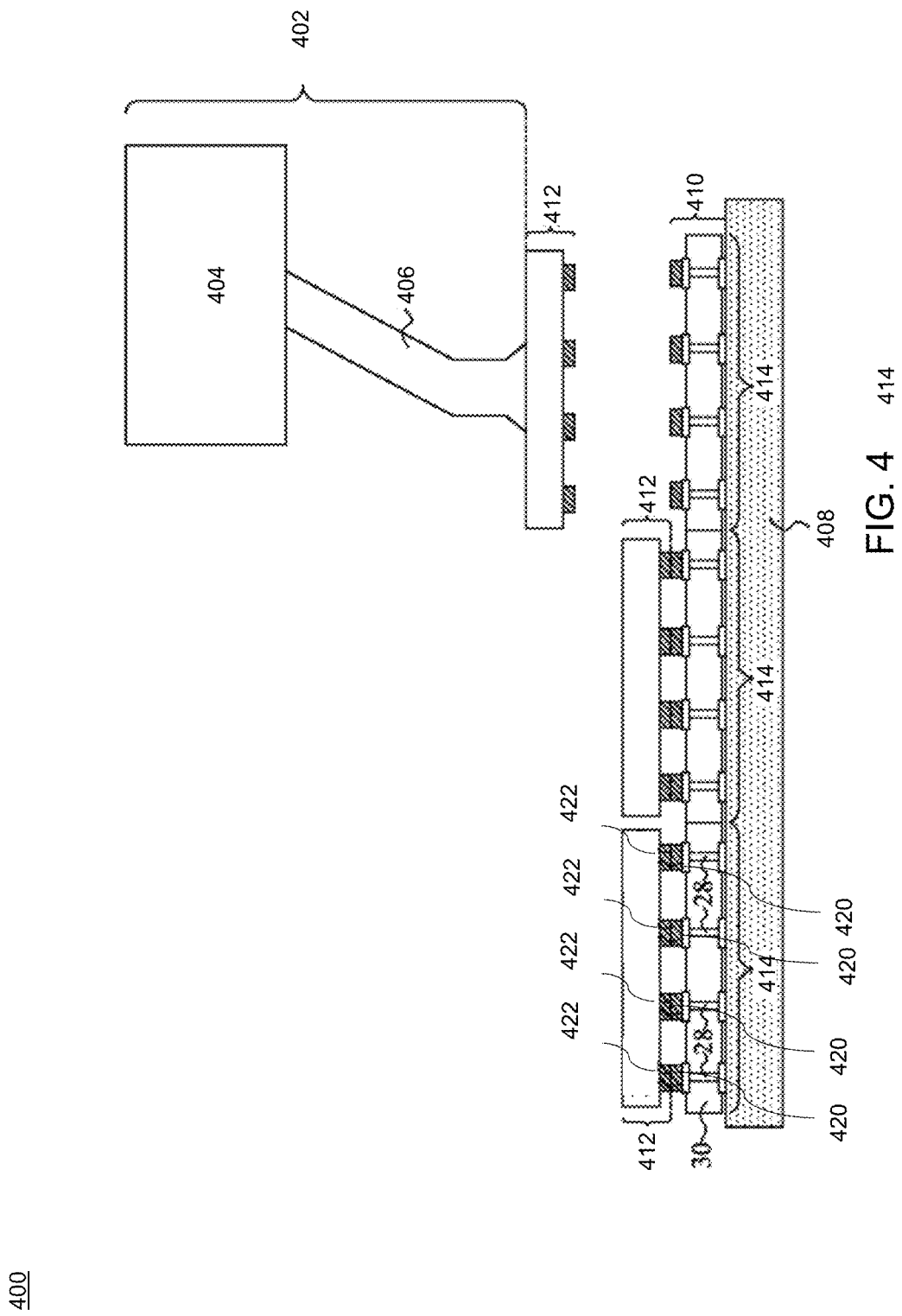
FIG. 4 illustrates a system including a pick-and-place tool, which may be configured to pick up and place a plurality of components, and to assemble the components into jig assemblies, according to various embodiments.

FIG. 4 illustrates a system 400 including a pick-and-place tool 402, which may be configured to pick up and place a plurality of components, and to assemble the components into jig assemblies, according to various embodiments. In some embodiments, the pick-and-place tool 402 may include a control unit 404, and one or more pickup heads 406. Each of the pickup heads 406 may be controlled by a control unit 404 to perform various tasks, including picking up, placing, and in some embodiments, stacking, a plurality of different components.

FIG. 4 also illustrates a jig 408, a bottom package component 410 placed over the jig 408, and a plurality of top package components 412 placed over the bottom package component 410. In some embodiments, the jig 408 may include a plate having a planar top surface, on which bottom package component 410 may be placed. The jig 408 may be formed of ceramic, stainless steel, aluminum, copper, alloys thereof, etc. The bottom package component 410 may be a package substrate strip, although the bottom package component 410 may be another type of package component such as an interposer wafer, a packaged wafer, a device wafer, etc.

The package components 414, which may be included in the bottom package component 410, may be package substrates 104 (e.g., see FIGS. 1 to 3), or other types of package components in other embodiments. The package components 414 may be similar (or identical) to each other. In some embodiments, the package components 414 may be laminate package substrates, in which conductive traces 28 may be embedded in laminated dielectric layers 30. In alternative embodiments, the package components 414 may be built-up package substrates, which may include cores (not shown), and conductive traces (not shown) built on opposite sides of the cores. The conductive traces may be interconnected through conductive features in the core.

The top package components 412 may be dies (e.g., integrated circuit dies 102; see FIGS. 1 to 3), which may include active devices such as transistors (not shown) therein. In alternative embodiments, top package components 412 may be interposers, packages, etc. The package components 414 may include first metal connectors 420, and the top package components 412 may include second metal connectors 422. The first metal connectors 420 and the second metal connectors 422 may be free from solders or may have a thin solder surface (e.g., thickness less than about 3 μm), in accordance with various embodiments. Metals used in the first metal connectors 420 and the second metal connectors 422 may include a metal or a metal alloy including copper, gold, nickel, palladium, aluminum, and combinations thereof.

The pick-and-place tool 402 may be configured to use one or more of the pickup heads 406 to pick up and place the bottom package component 410 over and aligned with the jig 408, and to pick up and place the top package components 412 over and aligned with the respective package components 414. Furthermore, the pick-and-place tool 402 may control alignment of the second metal connectors 422 with the respective first metal connectors 420, so that the first metal connectors 420 and the second metal connectors 422 may be aligned in a one-to-one fashion. The picking up and placement of the top package components 412 may be performed one by one. In other embodiments, a plurality of pickup heads 406 may pick up and place a respective plurality of package components on bottom package component 410 in a single operation.

In various embodiments, bonding of top package components 412 to bottom package components 410 may be accomplished using a direct bonding process. In a direct bonding process, two metal bumps (or a metal bump and a bonding pad) may be bonded together without solder disposed between the two metal bumps. For example, the direct bonding may be a copper-to-copper bonding or a gold-to-gold bonding. The methods for performing direct bonding may include thermo-compression bonding (TCB). In a direct bonding process, the bumps 106 of an integrated circuit die 102 (e.g., see FIG. 1) may be aligned with, and placed against, the metal bumps or bonding pads 108 of a package substrate 104. A compressive force may then be applied to press the integrated circuit die 102 and the package substrate 104 against one another. During the bonding process, the integrated circuit die 102 and the package substrate 104 may also heated. With the applied pressure and the elevated temperature, surface portions of the metal bumps of the integrated circuit die 102 and the package substrate 104 may inter-diffuse, so that bonds may be formed. A solder layer with thickness less than 3 μm may be added to each side of the bumps 106 of the device die and the bonding pads 108 of the package substrate 104. In the direct bonding, the solder layers may be in contact with one another, and may be bonded with underlying non-flowable portions of the bumps 106 and bonding pads 108.

Figure 5B:
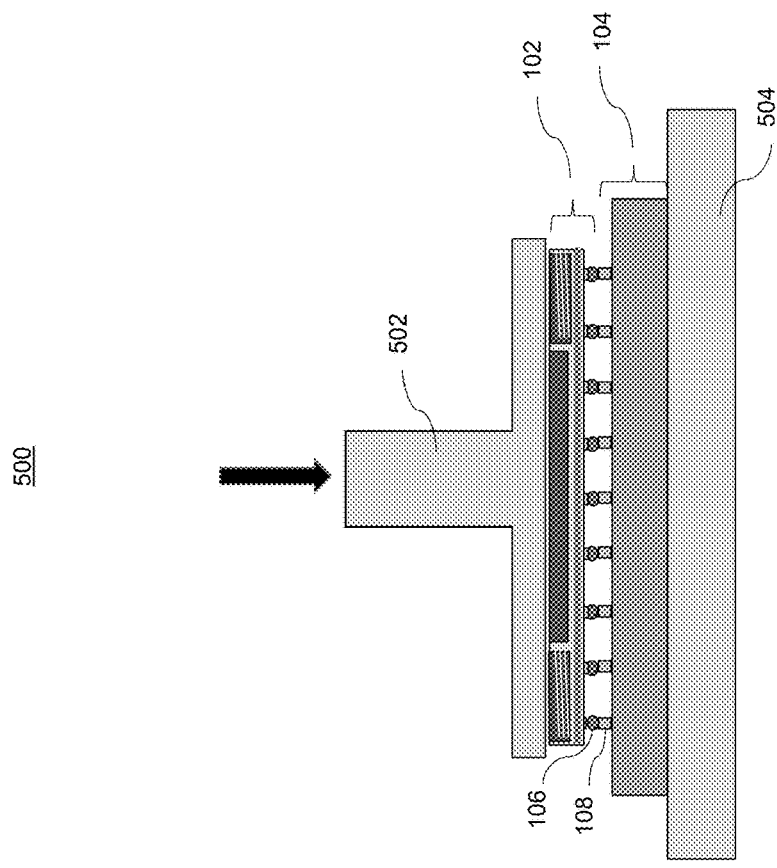
FIG. 5B illustrates a second configuration of the direct bonding apparatus in which the integrated circuit die is in contact with the package substrate, according to various embodiments.
Figure 5A:
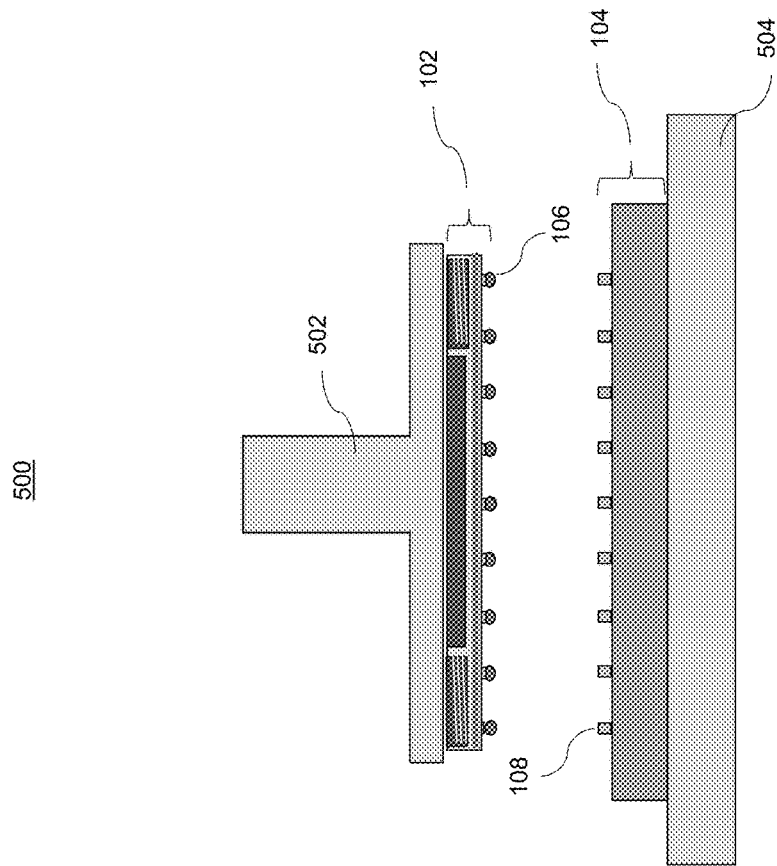
FIG. 5A illustrates a first configuration of a direct bonding apparatus in which an integrated circuit die is aligned with a package substrate prior to bonding of the integrated circuit die to the package substrate, according to various embodiments.

FIG. 5A illustrates a first configuration of a direct bonding apparatus 500 in which an integrated circuit die 102 may be aligned with a package substrate 104 prior to bonding of the integrated circuit die and the package substrate, and FIG. 5B illustrates a second configuration of the direct bonding apparatus 500 in which the integrated circuit die 102 is in contact with the a package substrate 104, according to various embodiments. The direct bonding apparatus 500 may include a bond head 502 that may be configured to hold the integrated circuit die 102. The direct bonding apparatus 500 may further include a chuck 504 that may be configured to hold the package substrate 104. The bond head 502 may be configured to position the integrated circuit die 102 relative to the package substrate 104 such that the plurality of bumps 106 of the integrated circuit die 102 are aligned with respective ones of the plurality of bonding pads 108 of the package substrate.

The bond head 502 may be similar to the pick-and-place tool 402, described above. In this regard, the bond head 502 may have a mechanism for picking up and holding the integrated circuit die 102. For example, the bond head 502 may have a pneumatic system that may be configured to pick up the integrated circuit die 102 by applying suction to the integrated circuit die 102. In contrast to the pick-and-place tool 402, however, the bond head 502 may further include a heating mechanism (not shown) that may be configured to supply heat to the integrated circuit die 102. Further, the bond head 502 may be configured to apply a compressive force between the integrated circuit die 102 and the package substrate 104, as described in greater detail below.

As shown in FIG. 5B, the bond head 502 may be configured to move vertically downward (e.g., as shown by the arrow) to thereby bring the integrated circuit die 102 into contact with the package substrate 104. As shown, the plurality of bumps 106 of the integrated circuit die 102 may be brought into direct contact with the bonding pads 108 of the package substrate 104. The bond head 502 may further be configured to exert a compressive force on the integrated circuit die 102 while the package substrate 104 is held in a fixed position by the chuck 504. In this way, the bumps 106 of the integrated circuit die 102 may be forced against the bonding pads 108 of the package substrate.

As mentioned above, the bond head 502 may be further configured to supply heat to the integrated circuit die 102. In some embodiments, the chuck 504 may further include a heating mechanism (not shown) that may be configured to supply heat to the package substrate 104. In this way, the bumps 106 and the bonding pads 108 may be raised to an elevated temperature. The application of pressure and heat may cause the bumps 106 to be bonded to the bonding pads 108. In this way, the integrated circuit die 102 and the package substrate 104 may be electrically and mechanically coupled to one another. In some embodiments, one or both of the bumps 106 and the bonding pads 108 may include a layer of solder. The heat may cause the solder to be reflowed and, upon solidification, the solder may form a bond between the bumps 106 and the bonding pads 108. In other embodiments, direct bonding between the bumps 106 and the bonding pads 108 may be accomplish without the presence of solder by a process of atomic inter-diffusion between the bumps and the bonding pads 108.

Various materials used to form the bumps 106 and the bonding pads 108 may oxidize. The presence of oxides resulting from the unintended oxidation process may hinder the formation of secure bonds between the bumps 106 and the bonding pads 108. In some embodiments, oxides may be removed by applying a flux material to one or both of the bumps 106 and the bonding pads 108. In other embodiments, oxides may be removed by exposing the bumps 106 of the integrated circuit die 102 and the bonding pads 108 of the package substrate to a plasma prior to bonding, as described in greater detail below.

Figure 6:
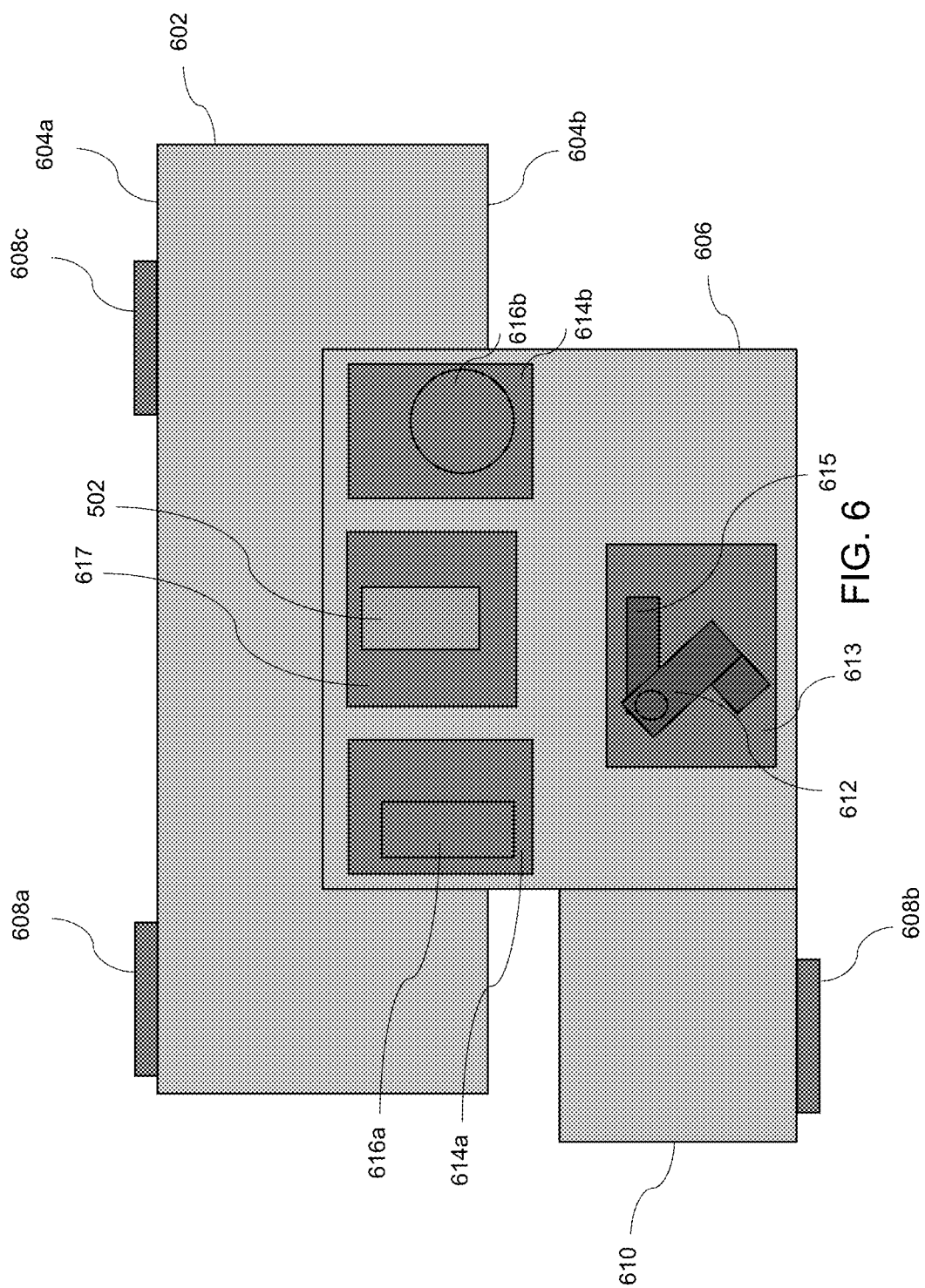
FIG. 6 is a top view of a block diagram of a system that is configured to bond an integrated circuit die to a package substrate, according to various embodiments.

FIG. 6 is a top view of a block diagram of a system 600 configured to bond a chip (e.g., integrated circuit die 102) to a substrate (e.g., package substrate 104), as described above with reference to FIGS. 5A and 5B, according to various embodiments. The system 600 may include an equipment front end module (EFEM) 602 having a front side 604a and a back side 604b. The back side 604b of the EFEM 602 may be coupled to a processing system 606. The processing system 606 may include a chip feed-in subsystem 610. The EFEM 602 may include a first port 608a that is configured to receive a substrate (e.g., package substrate 104 or wafer). The chip feed-in subsystem 610 may include a second port 608b that is configured to receive a chip (e.g., integrated circuit die 102). The EFEM 602 and the processing system 606 may have various mechanical mechanisms that may be configured to respectively receive the substrate/wafer and the chip and to position the substrate/wafer and the chip within the system 600. For example, the bonding subsystem may include a positioning device 612 (e.g., a robot) that may be configured to receive an integrated circuit die 102 from the chip feed-in subsystem 610. As shown, the positioning device 612 may include a chip feeding arm 615 that may include a pick-and-place tool 402 (e.g., see FIG. 4) or similar mechanical device that is configured to pick up and position an integrated circuit die 102 or other type of chip.

The positioning device 612 may be configured to receive an integrated circuit die 102 from the second port 608b and to move the integrated circuit die 102 into a chip processing subsystem 613. The chip processing subsystem 613 may be configured to expose the integrated circuit die 102 to a controlled environment. For example, the chip processing subsystem 613 may include an enclosure (e.g., enclosure 704; see FIG. 7) including one or more gases that may be maintained at a pressure in a range from approximately 10 Pa to approximately 120 KPa. Further, the one or more gasses may include a concentration of oxygen that is less than approximately 1,000 ppm. In some embodiments, the enclosure may be maintained at atmospheric pressure (i.e., 101325 Pa) and the plasma may be similarly generated at atmospheric pressure. The chip processing subsystem 613 may further include a plasma generation device (e.g., plasma generation device 706; see FIG. 7) that may be configured to expose the integrated circuit die 102 to a plasma, as described in greater detail below. Oxides may be removed from bumps 106 of the integrated circuit die 102 by exposure to the plasma. Further, oxides may be prevented from re-forming by ensuring that the chip is maintained in a low oxygen environment.

The processing system 606 may include one or more substrate processing subsystems. For example, the processing system 606 may include a first substrate processing subsystem 614a and a second substrate processing subsystem 614b. In this example, the first substrate processing subsystem 614a may be configured to receive a first substrate 616a from the EFEM 602 and the second substrate processing subsystem 614b may be configured to receive a second substrate 616b from the EFEM 602. The first substrate processing subsystem 614a and the second substrate processing subsystem 614b may be configured to accommodate substrates having various geometric configurations. For example the first substrate processing subsystem 614a may be configured to receive a rectangular-shaped substrate (e.g., see the first substrate 616a in FIG. 6) and the second substrate processing subsystem 614b may be configured to receive a circular shaped substrate (e.g., a wafer; see the second substrate 616b in FIG. 6). In an example embodiment, one or both of the first substrate 616a and the second substrate 616b may include a package substrate 104 (e.g., see FIGS. 5A and 5B).

The first substrate processing subsystem 614a and the second substrate processing subsystem 614b may each be configured to respectively expose the first substrate 616a and the second substrate 616b to a controlled environment. For example, the first substrate processing subsystem 614a and the second substrate processing subsystem 614b may each include an enclosure including one or more gases that are maintained at a pressure in a first range from approximately 10 Pa to approximately 120 KPa. Further, the one or more gasses may include a concentration of oxygen that is less than approximately 1,000 ppm. Further, the first substrate processing subsystem 614a and the second substrate processing subsystem 614b may each include a plasma generation device (not shown) that may be configured to expose the substrate to a plasma, as described in greater detail below.

Oxides may be removed from bonding pads of the of the first substrate 616a and the second substrate 616b by application of the plasma. Further, oxides may be prevented from re-forming by ensuring that the first substrate 616a and the second substrate 616b are maintained in a low oxygen environment.

The processing system 606 may further include bonding subsystem 617 that may include a bond head 502 and a chuck 504 (e.g., not shown in FIG. 6; see FIGS. 5A and 5B). As described above, the bond head 502 may be configured to pick up and to position an integrated circuit die 102 (e.g., see FIGS. 5A and 5B) or other chip. The chuck 504 may be configured to hold the substrate during the bonding process, described above. Various positioning systems may be configured to receive a substrate (e.g., a package substrate 104) from the first substrate processing subsystem 614a and/or the second substrate processing subsystem 614b, and to position the package substrate 104 on the chuck 504. Further, the bonding subsystem 617 may be configured to receive a chip (e.g., an integrated circuit die 102) from the chip processing subsystem 613. For example, the bond head 502 may receive an integrated circuit die 102 from the positioning device 612 of the chip processing subsystem 613. After the bonding process has been completed, a bonded structure including the chip bonded to the substrate may be provided to other systems through a third port 608c of the EFEM 602.

Figure 7:
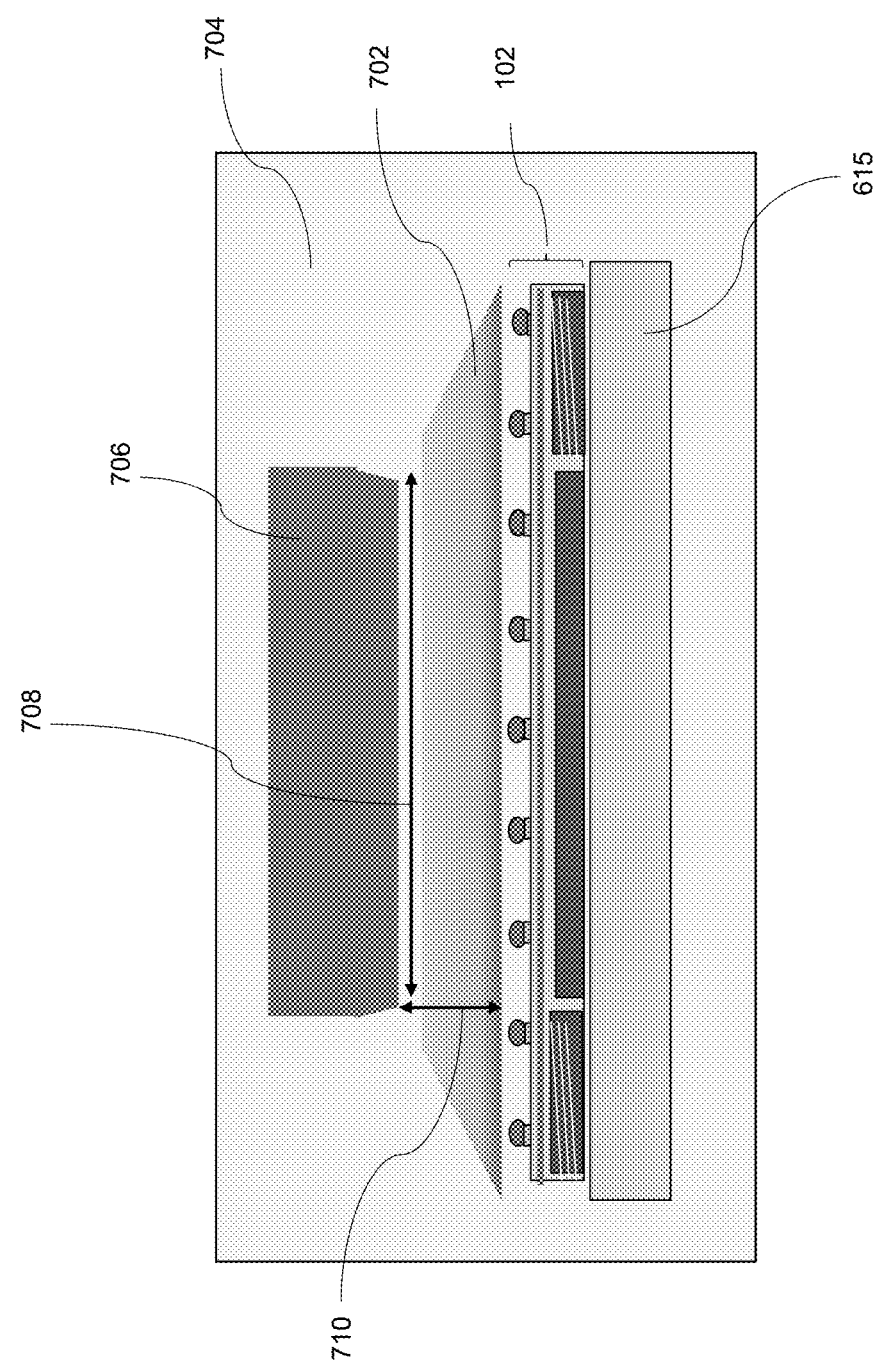
FIG. 7 is a cross-sectional view of a system that is configured to expose an integrated circuit die to a plasma, according to various embodiments.

FIG. 7 is a vertical cross-sectional view of a system 700 configured to expose an integrated circuit die 102 to a plasma 702, according to various embodiments. In this example, the integrated circuit die 102 may be held by the chip feeding arm 615 (e.g. see FIG. 6) within an enclosure 704. As described above, the enclosure 704 may be maintained at a predetermined pressure and oxygen concentration. The chip feeding arm 615 may be configured to hold the integrated circuit die 102 within proximity to a plasma generation device 706. The plasma generation device 706 may be configured to supply the plasma 702 through a nozzle having a nozzle opening size 708 that has an area in a range from approximately 0.01 mm×0.01 mm to approximately 340 mm×340 mm. The plasma generation device 706 may also be configured to supply the plasma 702 to the integrated circuit die 102 at a distance from the integrated circuit die 102 such that the distance between the nozzle and the integrated circuit die 102 is less than the nozzle opening size 708. For example, the plasma generation device 706 may be configured to supply the plasma 702 to the integrated circuit die 102 at a distance 710 from the integrated circuit die 102 that is in a range from approximately 0.01 mm to approximately 100 mm.

Figure 8:
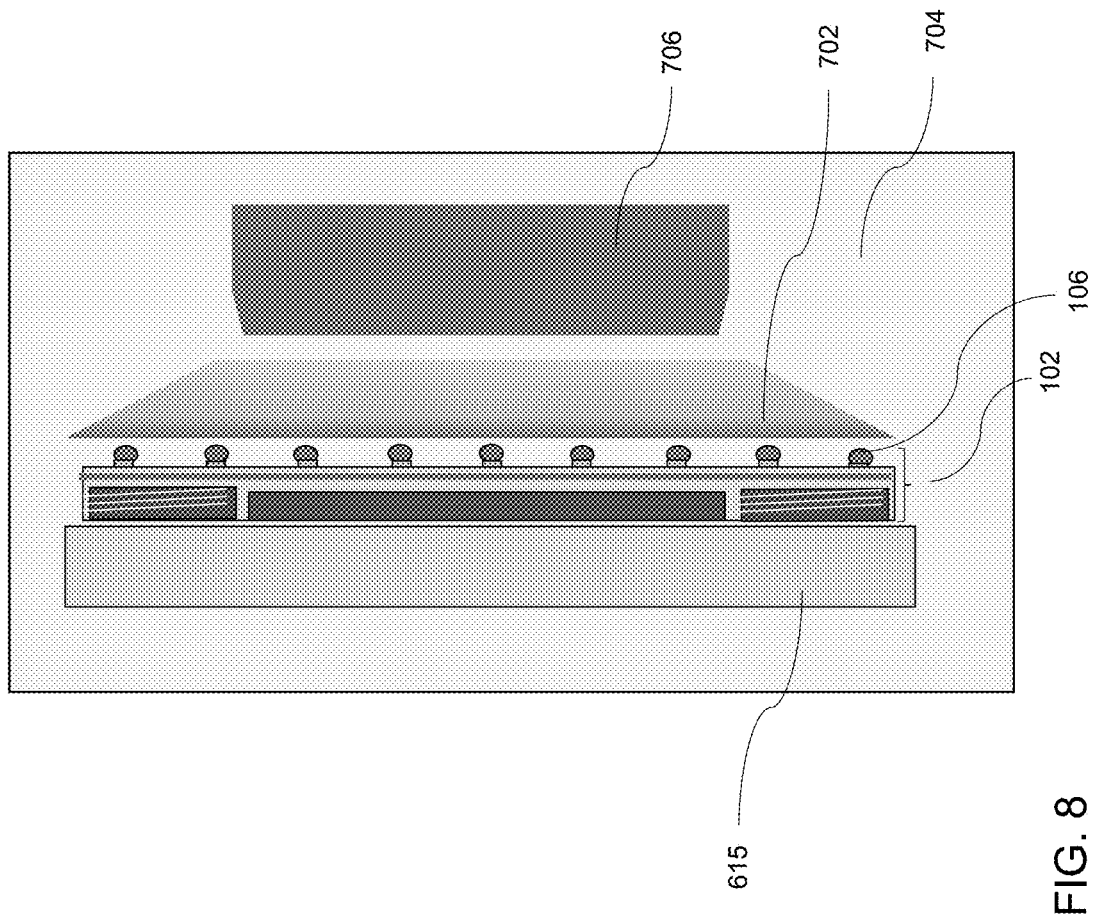
FIG. 8 is a cross-sectional view of an alternative system that is configured to expose an integrated circuit die to a plasma, according to various embodiments.
Figure 9:
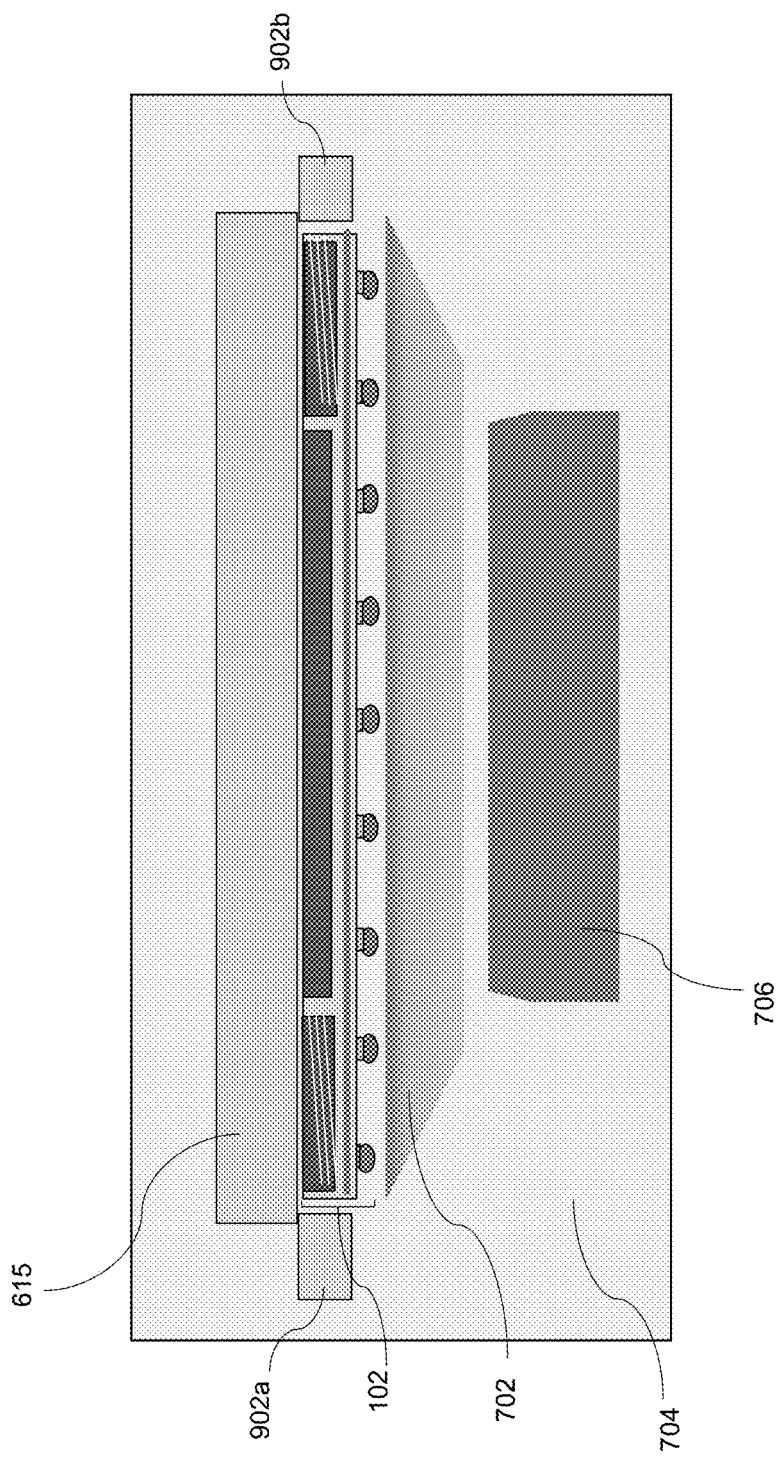
FIG. 9 is a cross-sectional view of another alternative system that is configured to expose an integrated circuit die to a plasma, according to various embodiments.

FIG. 8 is a vertical cross-sectional view of another embodiment system 800, configured to expose the integrated circuit die 102 to the plasma 702, having a first orientation relative to the system 700 of FIG. 7, and FIG. 9 is a vertical cross-sectional view of another embodiment system 900, configured to expose an integrated circuit die 102 to the plasma 702, having a second orientation relative to the system 700 of FIG. 7. For example, the embodiment system 800 of FIG. 8 is similar to the embodiment system 700 of FIG. 7 although the embodiment system 800 may have a configuration that is rotated by 90° from that of system 700. As such, the plasma generation device 706 may be configured to supply the plasma 702 in a sideways horizontal direction. Further, as shown in FIG. 8, the chip feeding arm 615 may be configured to hold the integrated circuit die 102 such that the bumps 106 are facing sideways toward the plasma generation device 706. As with the embodiment system 700 of FIG. 7, the integrated circuit die 102 may be exposed to the plasma 702 within an enclosure 704 having a controlled environment (e.g., having a predetermined pressure and oxygen concentration). The dimensions and relative spacing of the plasma generation device 706 and the integrated circuit die 102 may be similar to those of embodiment system 700. Other embodiments, however, may include different dimensions and relative spacings.

The embodiment system 900 of FIG. 9 is similar to the system 700 of FIG. 7 and the embodiment system 800 of FIG. 8 although the embodiment system 900 has a configuration that is rotated by 180° from that of system 700, and that is rotated 90° from that of embodiment system 800 of FIG. 8. As such, in the embodiment system 900, the plasma generation device 706 may be configured to supply the plasma 702 in an upwards direction. Further, as shown in FIG. 9, the chip feeding arm 615 may be configured to hold the integrated circuit die 102 such that the bumps 106 are facing downward toward the plasma generation device 706. As with the embodiment system 700 of FIG. 7, and the embodiment system 800 of FIG. 8, the integrated circuit die 102 may be exposed to the plasma 702 within an enclosure 704 having a controlled environment having a predetermined pressure and oxygen concentration. The dimensions and relative spacing of the plasma generation device 706 and the integrated circuit die 102 may be similar to those of the embodiment system 700 and the embodiment system 800. Other embodiments, however, may include different dimensions and relative spacings. The embodiment system 900 of FIG. 9 may further have additional components, such as a holder having a first holder component 902a and second holder component 902b. In further embodiments (not shown) the plasma generation device 706 may be held at any non-vertical angle but aimed at a surface of the integrated circuit die 102 (e.g., see FIG. 8).

Figure 10:
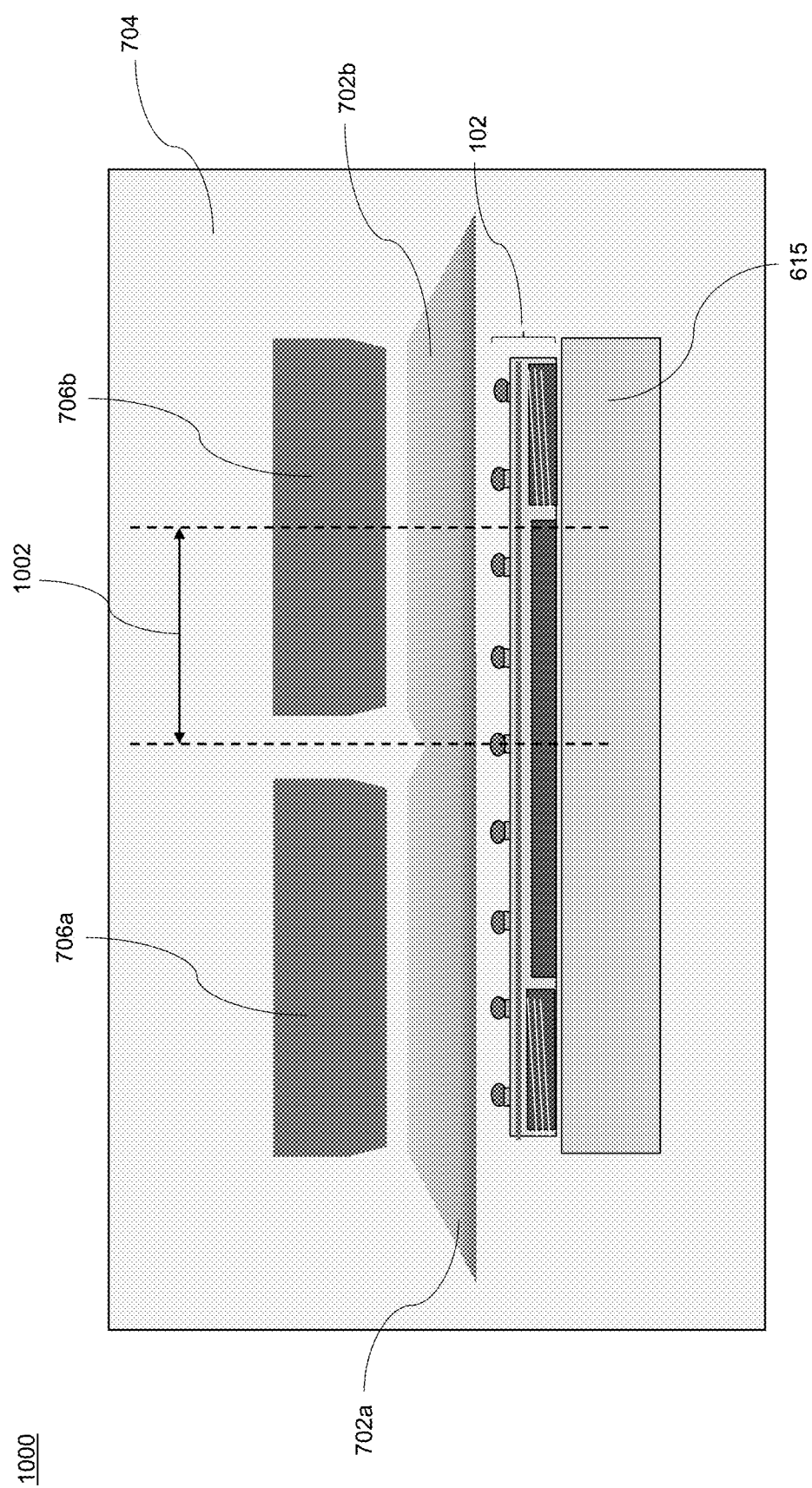
FIG. 10 is a cross-sectional view of another alternative system that is configured to expose an integrated circuit die to a plasma, according to various embodiments.

FIG. 10 is a vertical cross-sectional view of another embodiment system 1000 configured to expose an integrated circuit die 102 to a plasma (702a, 702b. In this example, the embodiment system 1000 may include a first plasma generation device 706a and a second plasma generation device 706b. The first plasma generation device 706a and the second plasma generation device 706b may be configured to respectively generate a first plasma 702a and a second plasma 702b. The use of two or more plasma generation devices may allow increased uniformity of the plasma (702a, 702b) due to spatial overlap between the first plasma 702a and the second plasma 702b. In various embodiments, the first plasma generation device 706a and the second plasma generation device 706b may each be displaced from a center of the integrated circuit die 102 by a displacement distance 1002 that is in range from approximately 0 mm to approximately 100 mm.

Figure 11:
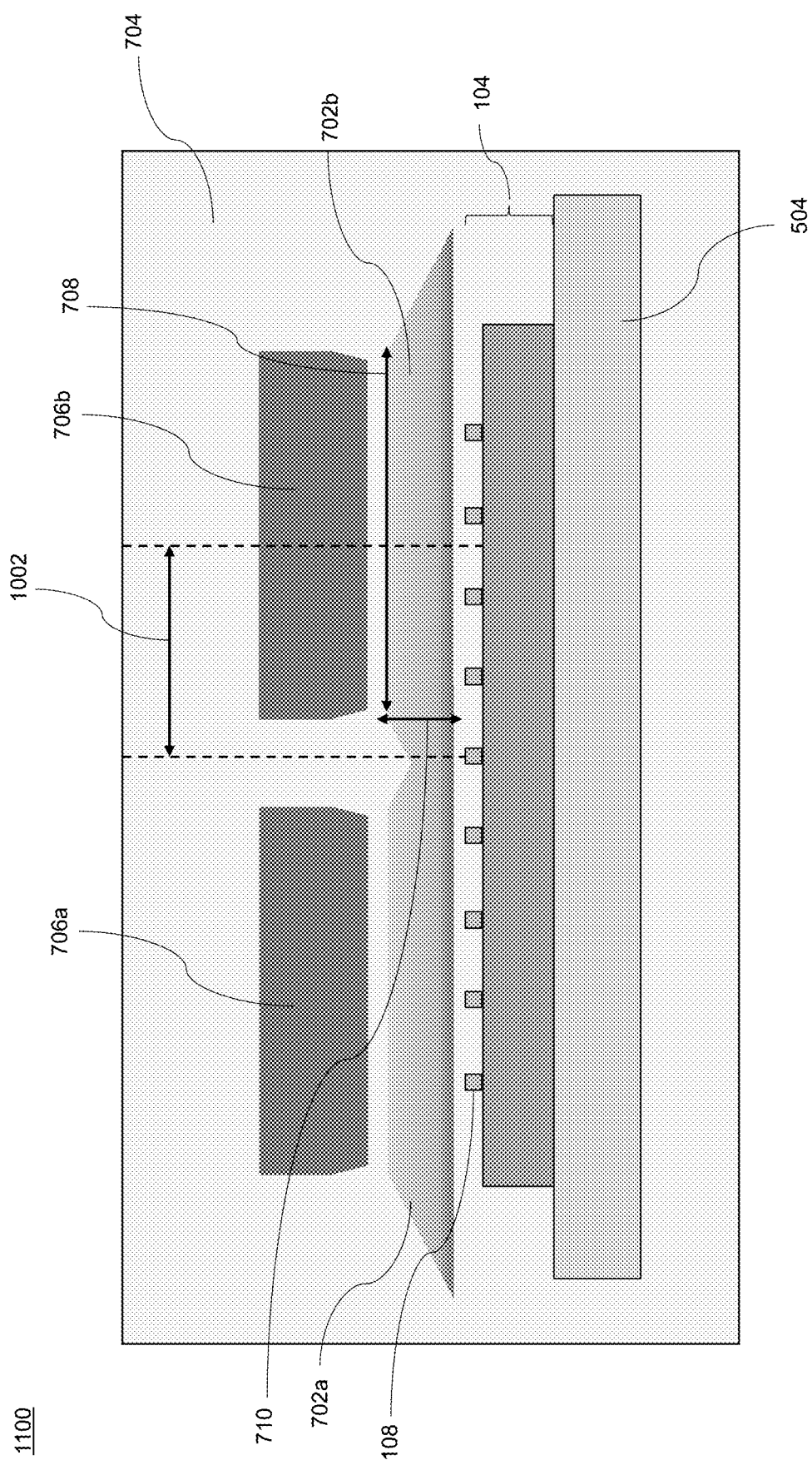
FIG. 11 is a cross-sectional view of a system that is configured to expose a substrate to a plasma, according to various embodiments.

FIG. 11 is a vertical cross-sectional view of an embodiment system 1100 configured to expose a package substrate 104 to a plasma. In this example, the package substrate 104 may be held by the chuck 504 (e.g. see FIGS. 5A and 5B) withing an enclosure 704. As described above, the enclosure may be maintained at a predetermined pressure and oxygen concentration. In this example, the embodiment system 1100 may include a first plasma generation device 706a and a second plasma generation device 706b. The first plasma generation device 706a and the second plasma generation device 706b may be configured to respectively generate a first plasma 702a and a second plasma 702b. The use of two or more plasma generation devices may allow increased uniformity of the plasma due to spatial overlap between the first plasma 702a and the second plasma 702b. Each of the first plasma generation device 706a and the second plasma generation device 706b may be configured to supply a plasma (702a, 702b) through a nozzle having a nozzle opening size 708 that has an area in a range from approximately 0.01 mm×0.01 mm to approximately 340 mm×340 mm.

Each of the first plasma generation device 706a and the second plasma generation device 706b may also be configured to supply the plasma (702a, 702b) to the package substrate 104 at a distance from the chip or the substrate that is less than a width of the nozzle. For example, each of the first plasma generation device 706a and the second plasma generation device 706b may be configured to supply the plasma (702a, 702b) to the package substrate 104 at a distance 710 from the package substrate 104 that is in a range from approximately 0.01 mm to approximately 100 mm. In various embodiments, the first plasma generation device 706a and the second plasma generation device 706b may each be displaced from a center of the integrated circuit die 102 by a displacement distance 1002 that is in range from approximately 0 mm to approximately 400 mm. Although in this example, the system 1100 is shown having two plasma generation devices, other embodiments may include a single plasma generation device or may include three or more plasma generation devices.

Figure 12:
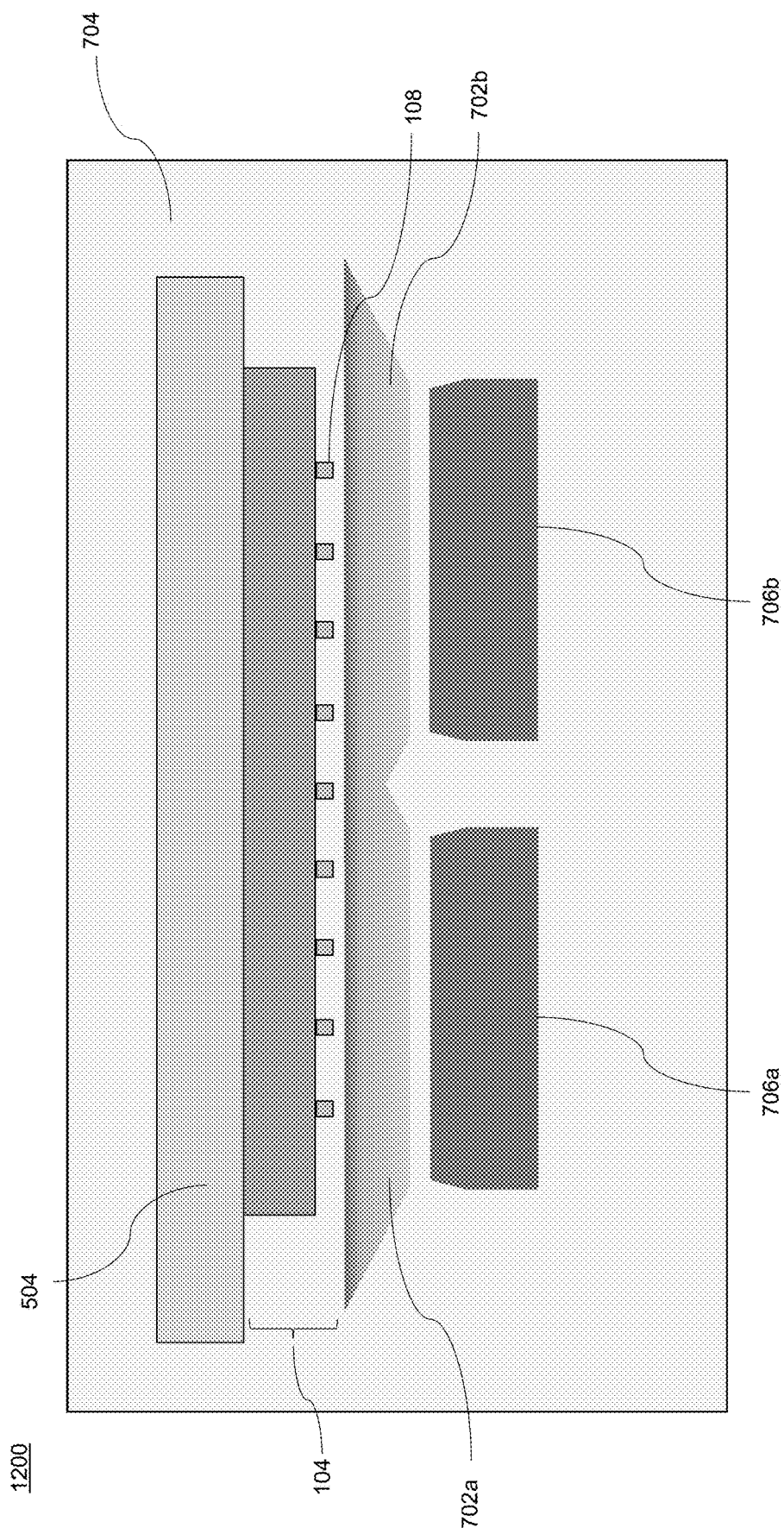
FIG. 12 is a cross-sectional view of an alternative system that is configured to expose a substrate to a plasma, according to various embodiments.

FIG. 12 is a vertical cross-sectional view of another embodiment system 1200 that may be configured to expose a package substrate 104 to a plasma (702a, 702b. The embodiment system 1200 of FIG. 12 may be similar to the embodiment system 1100 of FIG. 1100 although the embodiment system 1200 has a configuration that is rotated by 180° from that of embodiment system 1100. As such, the first plasma generation device 706a and the second plasma generation device 706b may be configured to supply the first plasma 702a and the second plasma 702b in an upwards direction. Further, as shown in FIG. 12, the chuck 504 may be configured to hold the package substrate 104 such that the bonding pads 108 are facing downward toward the first plasma generation device 706a and the second plasma generation device 706b. As with the embodiment system 1100 of FIG. 11, the package substrate 104 may be exposed to a first plasma 702a and a second plasma 702b within an enclosure 704 having a predetermined pressure and oxygen concentration.

The dimensions and relative spacing of the first plasma generation device 706a, the second plasma generation device 706b, and the package substrate 104 may be similar to those of the embodiment system 1200 of FIG. 11. Other embodiments, however, may include different dimensions and relative spacings. In further embodiments (not shown) the one or both of the first plasma generation device 706*a*, the second plasma generation device 706*b* may be held at a non-vertical angle but aimed a surface of the package substrate 104. Although in this example, the embodiment system 1100 is shown having two plasma generation devices, other embodiments may include a single plasma generation device or may include three or more plasma generation devices.

The plasma generation devices (706, 706*a*, 706*b*) described above with reference to FIGS. 7 to 12 may be configured to generate a plasma from various gases including $H_2/N_2$, $H_2/Ar$, $H_2/He$, $NH_3/N_2$, $NH_3/Ar$, or $NH_3/He$. Further, the plasma generation devices (706, 706*a*, 706*b*) may be configured to generate a plasma at a process temperature that is in a range from approximately 10 C to approximately 450 C.

Figure 13:
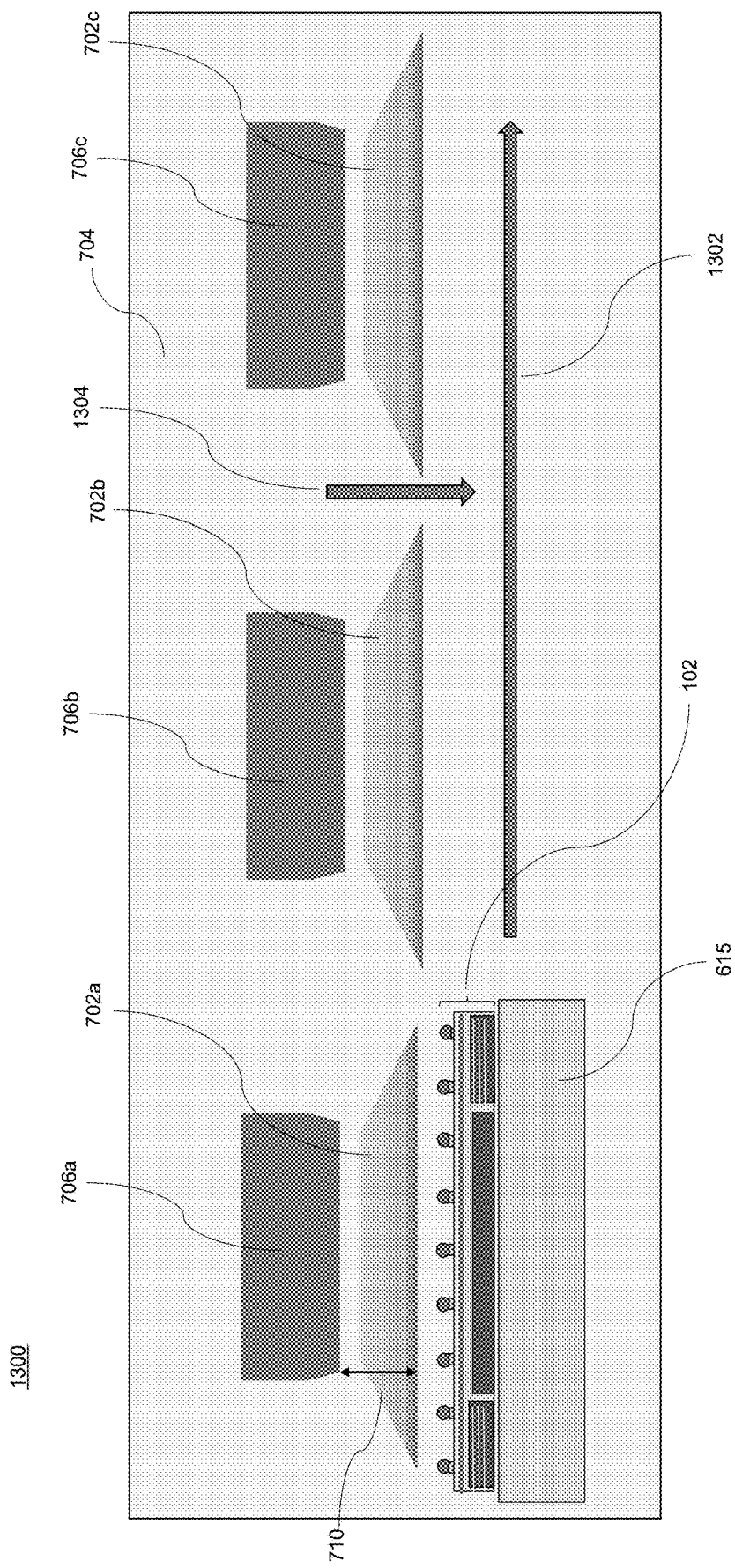
FIG. 13 is a cross-sectional view of another alternative system that is configured to expose an integrated circuit die to a plasma, according to various embodiments.

FIG. 13 is a vertical cross-sectional view of another embodiment system 1300 that may be configured to expose an integrated circuit die 102 to a plasma (702*a*, 702*b*, 702*c*). In this regard, the chip feeding arm 615 may be configured to move the integrated circuit die 102 relative to a plurality of plasma generation devices (706, 706*a*, 706*b*). For example, the embodiment system 1300 may include a first plasma generation device 706*a* that may be configured to generate a first plasma 702*a*, a second plasma generation device 706*b* that may be configured to generate a second plasma 702*b*, and a third plasma generation device 706*c* that may be configured to generate a third plasma 702*c*.

As shown in FIG. 13, the chip feeding arm 615 may be configured to move the integrated circuit die 102 past the first plasma generation device 706*a*, the second plasma generation device 706*b*, and the third plasma generation device 706*c*, along a first direction 1302. In this example, the first plasma generation device 706*a*, the second plasma generation device 706*b*, and the third plasma generation device 706*c* may be configured to respectively generate the first plasma 702*a*, the second plasma 702*b*, and the third plasma 702*c* so as to flow downwardly in a second direction 1304. In this example, the first direction 1302 is a horizontal direction and the second direction 1304 is a vertical direction. In this way, as the integrated circuit die 102 is moved along the first direction 1302, a vertical distance (e.g., distance 710) between each plasma generation device and a surface of the integrated circuit die 102 may be maintained.

As describe above in the context of other embodiments, the first plasma generation device 706*a*, the second plasma generation device 706*b*, and the third plasma generation device 706*c* may be configured to be located in an enclosure 704 having a predetermined pressure and oxygen concentration. Further, the chip feeding arm 615 may be configured to move the integrated circuit die 102 relative to the first plasma generation device 706*a*, the second plasma generation device 706*b*, and the third plasma generation device 706*c* at a rate that is in a range from approximately 0 mm/sec to approximately 400 mm/sec.

Figure 14:
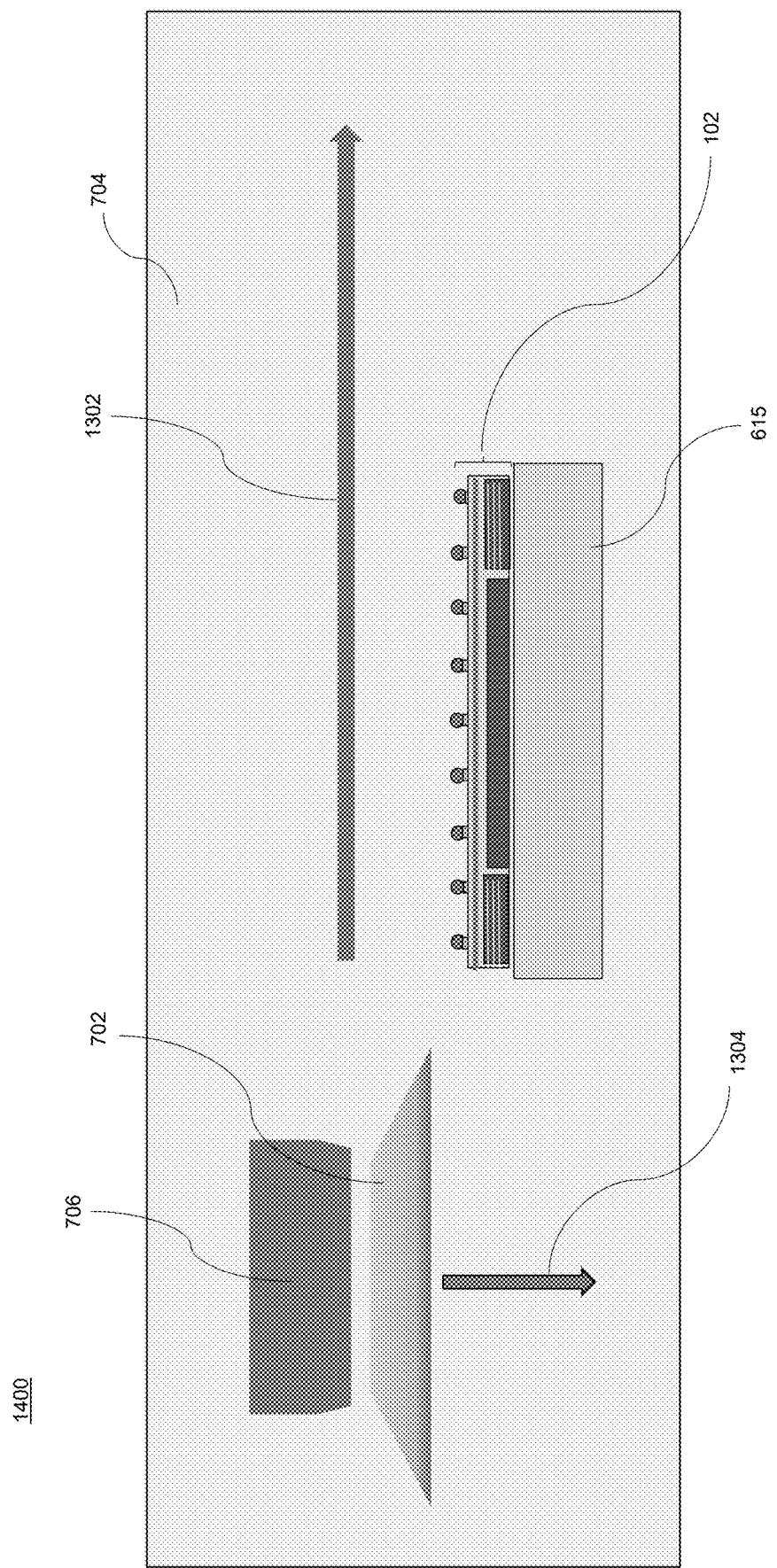
FIG. 14 is a cross-sectional view of another alternative system that is configured to expose an integrated circuit die to a plasma, according to various embodiments.

FIG. 14 is a vertical cross-sectional view of another embodiment system 1400 that may be configured to expose an integrated circuit die 102 to a plasma, according to various embodiments. In this example, a plasma generation device 706, which is configured to generate a plasma 702, is configured to move along a first direction 1302 relative to the integrated circuit die 102. As such, the chip feeding arm 615 may hold the integrated circuit die 102 in a fixed position while the plasma generation device 706 is moved along the first direction 1302. As shown, the plasma generation device 706 may be configured to generate the plasma 702 to flow in a second direction 1304, which may be perpendicular to the first direction 1302. As with the previously-described embodiments, the plasma generation device 706 may be configured to be located in an enclosure 704 having a controlled environment with a predetermined pressure and oxygen concentration. Further, the plasma generation device 706 may be configured to be moved relative to the integrated circuit die 102 at a rate that is in a range from approximately 0 mm/sec to approximately 400 mm/sec.

The embodiments described above with reference to FIGS. 13 and 14 only relate to relative motion of an integrated circuit die 102 and a plasma generation device (706, 706*a*, 706*b*, 706*c*), and are not limited thereto. Similar embodiments may include systems in which a package substrate 104 (e.g., see FIGS. 11 and 12) is moved relative to one or more stationary plasma generation devices (706*a*, 706*b*), or the one or plasma generation devices (706*a*, 706*b*) are moved relative to the package substrate 104.

Figure 15B:
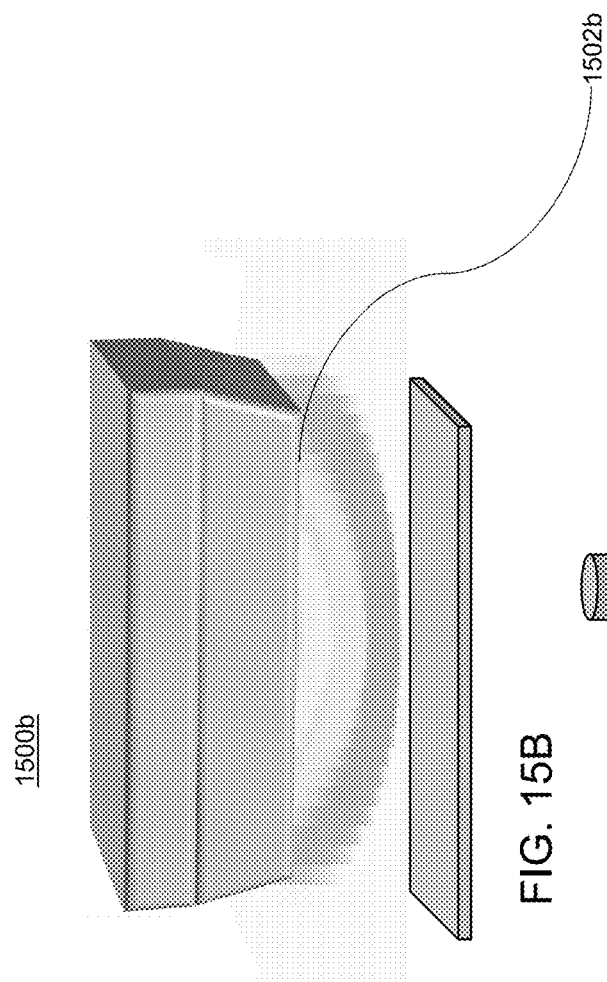
FIG. 15B illustrates a further example plasma generation device, according to various embodiments.
Figure 15D:
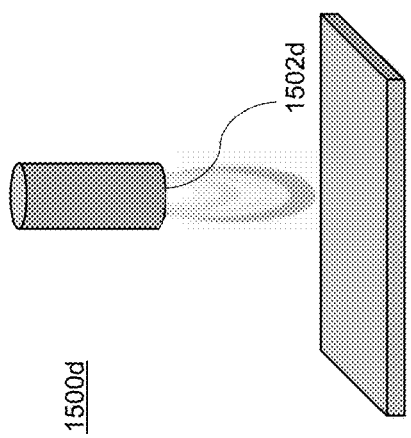
FIG. 15D illustrates a further example plasma generation device, according to various embodiments.
Figure 15A:
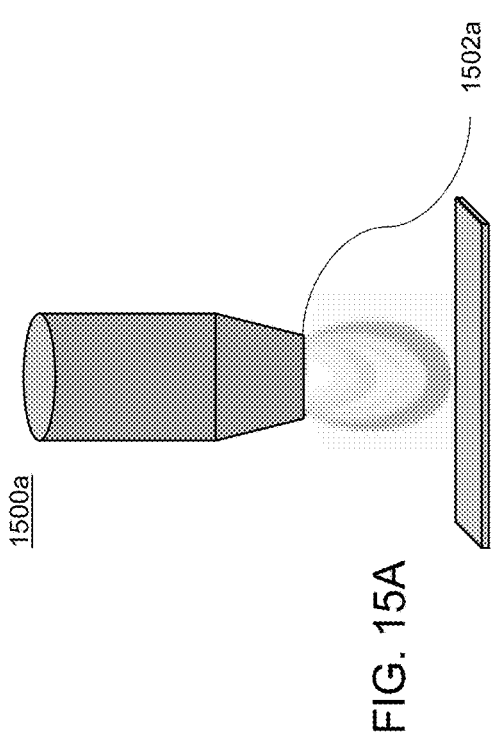
FIG. 15A illustrates an example plasma generation device, according to various embodiments.
Figure 15C:
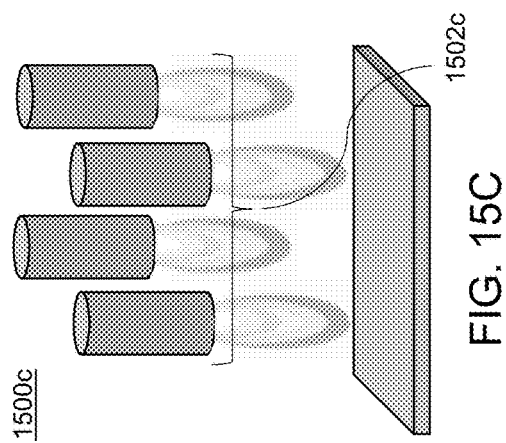
FIG. 15C illustrates a further example plasma generation device, according to various embodiments.

FIGS. 15A to 15D illustrate various plasma generation devices, according to various embodiments. As shown in FIGS. 15A and 15B, plasma generation devices may be configured to generate a plasma using a line-shaped aperture. In this regard, the plasma generation device 1500*a* of FIG. 15A includes a narrow line-shaped aperture 1502*a* while the plasma generation device 1500*b* of FIG. 15B includes a wide line-shaped aperture 1502*b*. In other embodiments, a plasma generation device may have one or more apertures. For example, the plasma generation device 1500*c* of FIG. 15C may include a matrix of apertures 1502*c* that may be configured to generate a corresponding plurality of plasma streams. In this example, each of the apertures in the matrix of apertures 1502*c* has a circular aperture. In other examples, the apertures in the matrix of apertures 1502*c* may be square-shaped, rectangular, or may have an irregular shape. In other embodiments, a plasma generation device 1500*d* may have a single circular aperture 1502*d*, as shown in FIG. 15D. Various other embodiments may include a single aperture or a matrix of apertures. Further, the apertures may have various shapes. As such, a plasma generation device may have a line-shaped aperture, a circular aperture, a square-shaped aperture, a rectangular aperture, or an irregularly-shaped aperture.

FIG. 16A illustrates a first configuration of a direct bonding apparatus 1600 in which an integrated circuit die 102 is aligned with a package substrate 104 prior to bonding of the integrated circuit die 102 to the package substrate 104, and FIG. 16B illustrates a second configuration of the direct bonding apparatus 1600 in which the integrated circuit die 102 is in contact with the a package substrate 104, according to various embodiments. The direct bonding apparatus 1600 may be similar to the direct bonding apparatus of FIGS. 5A and 5B. In contrast to the direct bonding apparatus 500 of FIGS. 5A and 5B, however the direct bonding apparatus 1600 may be located in a an enclosure 704 having a predetermined pressure and oxygen concentration.

Figure 17:
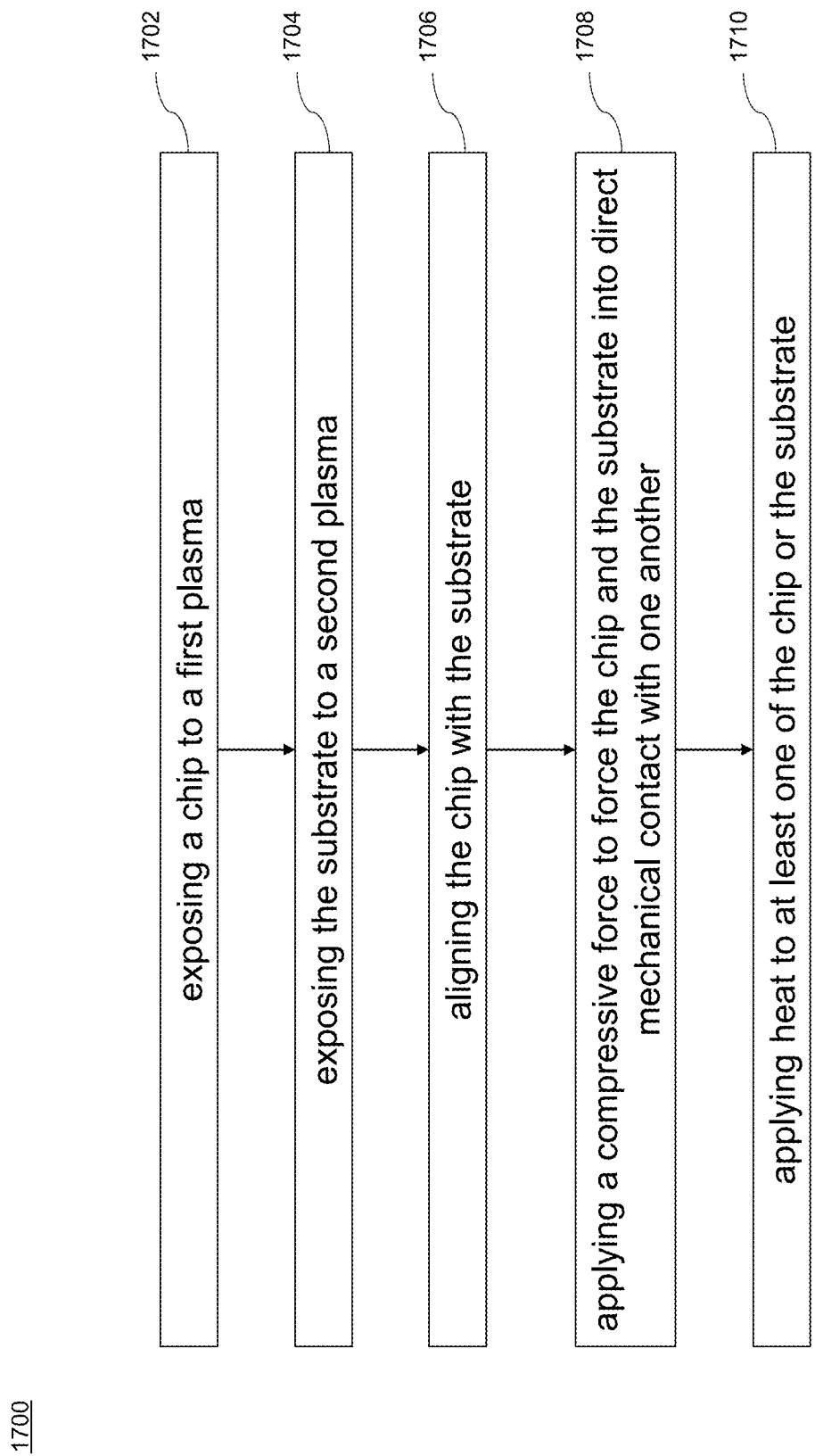
FIG. 17 is a flowchart illustration operations of a method of bonding a chip to a substrate, according to various embodiments.

The controlled environment of the enclosure 704 may act to prevent formation of oxides on the bumps 106 of the integrated circuit die 102 and on the bonding pads 108 of the package substrate 104. Thus, as described above, oxides may be removed from the bumps 106 and bonding pads 108 by application of plasma (702, 702*a*, 702*b*, 702*c*) by one or more of the systems described above with reference to FIGS. 7 to 15D. Then, the integrated circuit die 102 and the package substrate 104 may be maintained in a controlled environment having a predetermined pressure and oxygen concentration to thereby prevent oxides from re-forming on the bumps 106 and bonding pads 108 during the bonding process. The direct bonding apparatus 1600 of FIGS. 16A and 16B may otherwise be configured to operate similarly to the direct bonding apparatus 500, as described above with reference to FIGS. 5A and 15B in FIG. 17 is a flowchart illustration operations of a method 1700 of bonding a chip to a substrate, according to various embodiments. In operation 1702, the method 1700 may include exposing the chip to a first plasma (702, 702a, 702b, 702c). For example, the chip may be an integrated circuit die 102 (e.g., see FIGS. 7 to 10, 13, and 14). In operation 1704, the method 1700 may include exposing the substrate to a second plasma (702, 702a, 702b, 702c). For example, the substrate may be a package substrate 104 (e.g., see FIGS. 11 and 12). In operation 1706, the method 1700 may include aligning the chip with the substrate (e.g., see FIGS. 5A and 16A), and in operation 1708, the method 1700 may include applying a compressive force to force the chip and the substrate into direct mechanical contact with one another (e.g., see FIGS. 5B and 16B). In operation 1710, the method 1700 may include applying heat to at least one of the chip or the substrate (see FIGS. 5A, 5B, and related description), such that application of the compressive force and the heat thereby bonds the chip to the substrate.

The method may further include exposing the chip and the substrate to one or more gases that are maintained at a pressure in a first range from approximately 10 Pa to approximately 120 KPa, wherein the one or more gases include a concentration of oxygen that is less than approximately 1,000 ppm. In some embodiments, the gasses may be maintained at atmospheric pressure (i.e., 101325 Pa) and the plasma may be similarly generated at atmospheric pressure. The method 1700 may further include generating the first plasma or the second plasma to include $H_2/N_2$, $H_2/Ar$, $H_2/He$, $NH_3/N_2$, $NH_3/Ar$, or $NH_3/He$ in a temperature in a second range from approximately 10 C to approximately 450 C.

The method 1700 may further include exposing the chip to the first plasma (702, 702a, 702b, 702c) and exposing the substrate to the second plasma (702, 702a, 702b, 702c) by performing operations including moving (e.g., see FIG. 14) a plasma generation device (706, 706a, 706b, 706c) relative to the chip and the substrate at a rate of approximately 0 mm/sec to approximately 400 mm/sec while supplying the plasma (702, 702a, 702b, 702c) to the chip or the substrate, or moving (e.g., see FIG. 13) the chip and the substrate relative to the plasma generation device (706, 706a, 706b, 706c) at the rate of approximately 0 mm/sec to approximately 400 mm/sec.

Referring to all drawings and according to various embodiments of the present disclosure, a system (500, 600, 700, 800, 900, 1000, 1100, 1200, 1300, 1400), configured to bond a chip to a substrate, is provided. The system 600 may include a chip processing subsystem 613 that may be configured to receive the chip (e.g., integrated circuit die 102) and to expose the chip to a first plasma (702, 702a, 702b, 702c), and a substrate processing subsystem (614a, 614b) that may be configured to receive the substrate (e.g., package substrate 104) and to expose the substrate to a second plasma (702, 702a, 702b, 702c). The system 600 may further include a bonding subsystem 617 that is configured to align the chip with the substrate (e.g., see FIGS. 5A and 16A), to force the chip and the substrate into direct mechanical contact with one another by application of a compressive force, and to apply heat to at least one of the chip or the substrate (e.g., see FIGS. 5B and 16B). In this regard, the application of the compressive force and the heat thereby bonds the chip to the substrate.

In various embodiments, the chip processing subsystem 613 and the substrate processing subsystem (614a, 614b) each include an enclosure 704 (e.g., see FIGS. 7 to 14) including one or more gases that may be maintained at a pressure in a first range from approximately 10 Pa to approximately 120 KPa. The one or more gases may include a concentration of oxygen that is less than approximately 1,000 ppm. In some embodiments, the gasses may be maintained at atmospheric pressure (i.e., 101325 Pa) and the plasma may be similarly generated at atmospheric pressure. The first plasma (702, 702a, 702b, 702c) and the second plasma (702, 702a, 702b, 702c) may each include at least one of $H_2/N_2$, $H_2/Ar$, $H_2/He$, $NH_3/N_2$, $NH_3/Ar$, or $NH_3/He$.

In various embodiments, the chip processing subsystem 613 and the substrate processing subsystem (614a, 614b) each include a plasma generation device (706, 706a, 706b, 706c) that is configured to supply a plasma (702a, 702b, 702c) through a nozzle having a nozzle opening size 708 (e.g., see FIG. 7) that includes an area in a second range from approximately 0.01 mm×0.01 mm to approximately 340 mm×340 mm. Further, the plasma generation device (706, 706a, 706b, 706c) may be configured to supply the plasma (702, 702a, 702b, 702c) to the chip at a distance 710 from the chip that is in a third range from approximately 0.01 mm to approximately 100 mm. In general, the plasma generation device (706, 706a, 706b, 706c) may be configured to supply the plasma (702, 702a, 702b, 702c) to the chip at a distance 710 from the chip that is less than a width (e.g. nozzle opening size 708) of the nozzle.

In further embodiments, the plasma generation device (706a, 706b, 706c) may include two or more nozzles (e.g., see FIGS. 10, 11, 12, and 13). Further the nozzle of the plasma generation device (706a, 706b) of the chip processing subsystem 613 may be configured to be displaced from a center of the chip by a displacement distance 1002 (e.g., see FIGS. 10 and 11) that is in a fourth range from approximately 0 mm to approximately 100 mm. Further, nozzle of the plasma generation device (706a, 706b) of the substrate processing subsystem (614a, 614b) may be configured to be displaced from a center of the substrate by a displacement distance 1002 that is in a fifth range from approximately 0 mm to approximately 400 mm. Further, the nozzle may be configured to be oriented downwardly (e.g., see FIGS. 7, 10, 11, 13, and 14) toward the chip, upwardly (e.g., see FIGS. 9 and 12) toward the chip, or at a non-vertical angle (e.g., see FIG. 8) but aimed at a surface of the chip.

The chip processing subsystem 613 and the substrate processing subsystem (614a, 614b) may be respectively configured to expose the chip and the substrate to the first plasma (702, 702a, 702b, 702c) and the second plasma (702, 702a, 702b, 702c) at a process temperature that is in a sixth range from approximately 10 C to approximately 450 C. In further embodiments, the chip processing subsystem 613 and the substrate processing subsystem (614a, 614b) may each include a plasma generation device 706 that is configured to be moved (e.g., see FIG. 14) relative to at least one of the chip or the substrate at a rate of approximately 0 mm/sec to approximately 400 mm/sec while supplying the plasma 702 to at least one of the chip or the substrate.

In further embodiments, the chip processing subsystem 613 and the substrate processing subsystem (614a, 614b) may each include a plasma generation device that is configured to have a fixed position (e.g., see FIG. 13) and to supply the plasma (702, 702a, 702b, 702c) to at least one of the chip or the substrate while at least one of the chip or the substrate is moved (e.g., see FIG. 13) relative to the plasma generation device (706, 706a, 706b, 706c) at a rate of approximately 0 mm/sec to approximately 400 mm/sec.

In further embodiments, a system (500, 600, 700, 800, 900, 1000, 1100, 1200, 1300, 1400) that is configured to expose at least one of a chip (e.g., integrated circuit die 102) or a substrate (e.g., package substrate 104) to a plasma (702, 702a, 702b, 702c), is provided. The system may include an enclosure 704 (e.g., see FIGS. 7 to 14, 16A and 16B) including one or more gases that are maintained at a pressure in a first range from approximately 10 Pa to approximately 120 KPa. In this regard, the one or more gases may include a concentration of oxygen that is less than approximately 1,000 ppm. In some embodiments, the enclosure may be maintained at atmospheric pressure (i.e., 101325 Pa) and the plasma may be similarly generated at atmospheric pressure. The system may further include a mechanical system (502, 612, 615) configured to receive the chip or the substrate and to position at least one of the chip or the substrate within the enclosure 704. The system may further include a plasma generation device (706, 706a, 706b, 706c) within the enclosure 704 that is configured to supply the plasma (702, 702a, 702b, 702c) to at least one of the chip or the substrate through a nozzle that is configured to have at least one of a line-shaped aperture (e.g., see FIGS. 15A and 15B), a matrix of apertures (e.g., see FIG. 15C), a circular aperture (e.g., see FIGS. 15C and 15D), a square-shaped aperture, a rectangular aperture, or an irregularly-shaped aperture.

Disclosed embodiments provide advantages over conventional direct bonding methods by using plasma to remove oxides from metal bumps and bonding pads of components that are to be bonded. Generally, various materials used to form the bumps and the bonding pads may form oxides, which may hinder the formation of secure bonds. Conventional direct bonding methods often apply a flux material to bumps and bonding pads to remove oxides. The use of a flux to remove oxides, however, is a multi-step procedure using a flux application tool, a flux cleaning tool, and one or more baking procedures. The disclosed embodiments simplify the removal of oxides through the application of a plasma to bonding surfaces. The plasma removes the oxides and the bonding surfaces are maintained in a low oxygen environment to prevent re-formation of oxides prior to and during the bonding process. As such, the disclosed embodiments represent a simpler and faster process for direct bonding of a first component to a second component.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A system configured to bond a chip to a substrate, comprising:
    a chip processing subsystem that is configured to receive the chip and to expose the chip to a first plasma using a first plasma generation device;
    a substrate processing subsystem that is configured to receive the substrate and to expose the substrate to a second plasma using a second plasma generation device, the second plasma generation device being physically distinct from the first plasma generation device; and
    a bonding subsystem that is configured to align the chip with the substrate, to force the chip and the substrate into direct mechanical contact with one another by application of a compressive force, and to apply heat to at least one of the chip or the substrate,
    wherein the application of the compressive force and the heat thereby bonds the chip to the substrate.

2. The system of claim 1, wherein the chip processing subsystem and the substrate processing subsystem each comprise an enclosure comprising one or more gases that are maintained at a pressure in a first range from approximately 10 Pa to approximately 120 KPa.

3. The system of claim 2, wherein the one or more gases comprise a concentration of oxygen that is less than approximately 1,000 ppm.

4. The system of claim 1, wherein the first plasma and the second plasma each comprise $H_2/N_2$, $H_2/Ar$, $H_2/He$, $NH_3/N_2$, $NH_3/Ar$, or $NH_3/He$.

5. The system of claim 1, wherein the first generation device and the second plasma generation device each comprise a nozzle comprising a nozzle opening size that comprises an area in a second range from approximately 0.01 mm×0.01 mm to approximately 340 mm×340 mm.

6. The system of claim 5, wherein the plasma generation device is configured to supply the plasma to at least one of the chip or to the substrate at a distance from to at least one of the chip or the substrate that is in a third range from approximately 0.01 mm to approximately 100 mm.

7. The system of claim 5, wherein the plasma generation device is configured to supply the plasma to at least one of the chip or to the substrate at a distance from to at least one of the chip or the substrate that is less than a width of the nozzle.

8. The system of claim 5, wherein the plasma generation device comprises two or more nozzles.

9. The system of claim 5, wherein the nozzle of the plasma generation device of the chip processing subsystem is configured to be displaced from a center of the chip by a distance that is in a fourth range from approximately 0 mm to approximately 100 mm.

10. The system of claim 5, wherein the nozzle of the plasma generation device of the substrate processing subsystem is configured to be displaced from a center of the substrate by a distance that is in a fifth range from approximately 0 mm to approximately 400 mm.

11. The system of claim 5, wherein the nozzle is configured to be oriented downwardly toward at least one of the chip or the substrate, or upwardly toward at least one of the chip or the substrate.

12. The system of claim 1, wherein the chip processing subsystem and the substrate processing subsystem are respectively configured to expose the chip and the substrate to the first plasma and the second plasma at a process temperature that is in a sixth range from approximately 10 C to approximately 450 C.

13. The system of claim 1, wherein the chip processing subsystem and the substrate processing subsystem each comprise a plasma generation device that is configured to be moved relative to at least one of the chip or the substrate at a rate of approximately 0 mm/sec to approximately 400 mm/sec while supplying plasma to at least one of the chip or the substrate.

14. The system of claim 1, wherein the chip processing subsystem and the substrate processing subsystem each comprise a plasma generation device that is configured to have a fixed position and to supply plasma to at least one of the chip or the substrate while at least one of the chip or the substrate is moved relative to the plasma generation device at a rate of approximately 0 mm/sec to approximately 400 mm/sec.

15. A method of bonding a chip to a substrate, comprising:
    exposing the chip to a first plasma using a first plasma generation device;
    exposing the substrate to a second plasma using a second plasma generation device, the second plasma generation device being physically distinct from the first plasma generation device;
    aligning the chip with the substrate;
    applying a compressive force to force the chip and the substrate into direct mechanical contact with one another; and
    applying heat to at least one of the chip or the substrate,
    wherein application of the compressive force and the heat thereby bonds the chip to the substrate.

16. The method of claim 15, further comprising:
    exposing the chip and the substrate to one or more gases that are maintained at a pressure in a first range from approximately 10 Pa to approximately 120 KPa, wherein the one or more gases comprise a concentration of oxygen that is less than approximately 1,000 ppm,
    wherein at least one of the first plasma or the second plasma comprises $H_2/N_2$, $H_2/Ar$, $H_2/He$, $NH_3/N_2$, $NH_3/Ar$, or $NH_3/He$ comprising a temperature in a second range from approximately 10 C to approximately 450 C.

17. A system configured to bond a chip to a substrate, comprising:
    a chip processing subsystem configured to expose the chip to a first plasma generated by a first plasma generation device;
    a substrate processing subsystem configured to expose the substrate to a second plasma generated by a second plasma generation device, the second plasma generation device being physically distinct from the first plasma generation device; and
    a bonding subsystem configured to align the chip with the substrate, to apply a compressive force to the chip and the substrate, and to apply heat to at least one of the chip or the substrate,
    wherein at least one of the first plasma generation device and the second plasma generation device is configured to supply plasma to at least one of the chip or the substrate while being moved relative to the at least one of the chip or the substrate at a rate from approximately 0 mm/sec to approximately 400 mm/sec.

18. The system of claim 17, wherein the chip processing subsystem and the substrate processing subsystem each comprise an enclosure comprising one or more gases that are maintained at a pressure in a first range from approximately 10 Pa to approximately 120KPa.

19. The system of claim 18, wherein the one or more gases comprise a concentration of oxygen that is less than approximately 1,000 ppm.

20. The system of claim 17, wherein the first plasma and the second plasma each comprise $H_2/N_2$, $H_2/Ar$, $H_2/He$, $NH_3/N_2$, $NH_3/Ar$, or $NH_3/He$.

* * * * *